(12) United States Patent
Levesque et al.

(10) Patent No.:  US 12,587,172 B2
(45) Date of Patent:      Mar. 24, 2026

(54) PIN RECONFIGURABLE BAW FILTERS

(71) Applicant: Qorvo US, Inc., Greensboro, NC (US)

(72) Inventors: Chris Levesque, Fountain Valley, CA (US); Mudar Al-Joumayly, Casselberry, FL (US)

(73) Assignee: Qorvo US, Inc., Greensboro, NC (US)

( * ) Notice: Subject to any disclaimer, the term of this patent is extended or adjusted under 35 U.S.C. 154(b) by 108 days.

(21) Appl. No.: 18/594,165

(22) Filed: Mar. 4, 2024

(65)  Prior Publication Data

US 2024/0313743 A1      Sep. 19, 2024

Related U.S. Application Data

(60) Provisional application No. 63/452,202, filed on Mar. 15, 2023.

(51) Int. Cl.
H03H 9/74      (2006.01)
H03H 3/02      (2006.01)

(52) U.S. Cl.
CPC ................ H03H 9/74 (2013.01); H03H 3/02 (2013.01)

(58) Field of Classification Search
CPC ........... H03H 9/74; H03H 9/542; H03H 9/605
USPC .................................................. 333/187–192
See application file for complete search history.

(56)  References Cited

U.S. PATENT DOCUMENTS

| | | |
|---|---|---|
| 3,731,230 A | 5/1973 | Cerny, Jr. |
| 3,875,533 A | 4/1975 | Irwin et al. |
| 4,442,434 A | 4/1984 | Baekgaard |
| 4,577,168 A | 3/1986 | Hartmann |

(Continued)

FOREIGN PATENT DOCUMENTS

| | | |
|---|---|---|
| CN | 101154934 A | 4/2008 |
| CN | 104883153 A | 9/2015 |

(Continued)

OTHER PUBLICATIONS

Aigner, R et al., "3G—4G—5G: How BAW Filter Technology Enables a Connected World," 20th International Conference on Solid-State Sensors, Actuators and Microsystems & Eurosensors XXXIII (Transducers & Eurosensors XXXIII), Jun. 23-27, 2019, Berlin, Germany, IEEE, pp. 523-526.

(Continued)

*Primary Examiner* — Andrea Lindgren Baltzell
*Assistant Examiner* — Victor Cole
(74) *Attorney, Agent, or Firm* — Withrow & Terranova, P.L.L.C.

(57)  ABSTRACT

Front-end circuitry for a wireless communication device is disclosed. In some embodiments, the radio frequency (RF) front-end circuitry includes various transceiver chains. The transceiver chains may each include a bulk acoustic wave (BAW) filter. The BAW filter in each of the transceiver chains may each have the same filter design with various exposed external pins, such as input pins, output pins, and ground pins. With respect to the transceiver chains, a different combination of the external pins are hardwired depending on a desired placement of a passband. In this manner, switches and control circuitry for the switches are not needed in order to place the passband. Furthermore, BAW filters with the same filter design can be used in the different transceiver chains, thereby simplifying the manufacturing process of the front-end circuitry.

22 Claims, 9 Drawing Sheets

(56) References Cited

U.S. PATENT DOCUMENTS

| | | | |
|---|---|---|---|
| 5,291,159 A | 3/1994 | Vale | |
| 5,821,833 A | 10/1998 | Lakin | |
| 6,067,391 A | 5/2000 | Land | |
| 6,670,866 B2 | 12/2003 | Ellaet et al. | |
| 6,714,099 B2 | 3/2004 | Hikita et al. | |
| 6,720,844 B1 | 4/2004 | Lakin | |
| 6,927,649 B2 | 8/2005 | Metzger et al. | |
| 6,927,651 B2 | 8/2005 | Larson, III et al. | |
| 6,975,183 B2 | 12/2005 | Aigner et al. | |
| 7,057,478 B2 | 6/2006 | Korden et al. | |
| 7,173,504 B2 | 2/2007 | Larson, III et al. | |
| 7,239,067 B2 | 7/2007 | Komuro et al. | |
| 7,321,183 B2 | 1/2008 | Ebuchi et al. | |
| 7,342,351 B2 | 3/2008 | Kubo et al. | |
| 7,367,095 B2 | 5/2008 | Larson, III et al. | |
| 7,391,285 B2 | 6/2008 | Larson, III et al. | |
| 7,436,269 B2 | 10/2008 | Wang et al. | |
| 7,515,018 B2 | 4/2009 | Handtmann et al. | |
| 7,804,374 B1 | 9/2010 | Brown et al. | |
| 7,825,749 B2 | 11/2010 | Thalhammer et al. | |
| 7,855,618 B2 | 12/2010 | Frank et al. | |
| 7,889,024 B2 | 2/2011 | Bradley et al. | |
| 7,898,493 B1 | 3/2011 | Rojas et al. | |
| 7,956,705 B2 | 6/2011 | Meister et al. | |
| 7,973,620 B2 | 7/2011 | Shirakawa et al. | |
| 8,130,058 B2 | 3/2012 | Cardona et al. | |
| 8,248,185 B2 | 8/2012 | Choy et al. | |
| 8,508,315 B2 | 8/2013 | Jamneala et al. | |
| 8,575,820 B2 | 11/2013 | Shirakawa et al. | |
| 8,576,024 B2 | 11/2013 | Erb et al. | |
| 8,923,794 B2 | 12/2014 | Aigner | |
| 8,981,627 B2 | 3/2015 | Sakuma et al. | |
| 8,991,022 B2 | 3/2015 | Satoh et al. | |
| 9,054,671 B2 | 6/2015 | Adkisson et al. | |
| 9,054,674 B2 | 6/2015 | Inoue et al. | |
| 9,197,189 B2 | 11/2015 | Miyake | |
| 9,203,375 B2 | 12/2015 | Bauer et al. | |
| 9,243,316 B2 | 1/2016 | Larson, III et al. | |
| 9,484,883 B2 | 11/2016 | Nishizawa et al. | |
| 9,698,756 B2 | 7/2017 | Khlat et al. | |
| 9,729,125 B2 | 8/2017 | Nosaka | |
| 9,837,983 B2 | 12/2017 | Xu et al. | |
| 9,837,984 B2 | 12/2017 | Khlat et al. | |
| 9,847,769 B2 | 12/2017 | Khlat et al. | |
| 9,887,686 B2 | 2/2018 | Kuwahara | |
| 9,906,206 B2 | 2/2018 | Shih et al. | |
| 9,929,716 B2 | 3/2018 | Lee et al. | |
| 10,009,001 B2 | 6/2018 | Jiang et al. | |
| 10,141,644 B2 | 11/2018 | Khlat et al. | |
| 10,804,882 B2 | 10/2020 | Matsubara et al. | |
| 11,444,642 B2 | 9/2022 | Wang | |
| 2002/0109564 A1 | 8/2002 | Tsai et al. | |
| 2003/0060170 A1* | 3/2003 | Tikka | H03H 9/70 |
| | | | 455/73 |
| 2004/0100342 A1 | 5/2004 | Nishihara et al. | |
| 2004/0140869 A1 | 7/2004 | Marksteiner et al. | |
| 2004/0227590 A1 | 11/2004 | Larson, III et al. | |
| 2004/0263286 A1 | 12/2004 | Unterberger | |
| 2005/0057117 A1 | 3/2005 | Nakatsuka et al. | |
| 2005/0093648 A1 | 5/2005 | Inoue | |
| 2005/0206476 A1 | 9/2005 | Ella et al. | |
| 2006/0091978 A1 | 5/2006 | Wang et al. | |
| 2006/0232361 A1 | 10/2006 | Wang et al. | |
| 2008/0007369 A1 | 1/2008 | Barber et al. | |
| 2008/0169884 A1 | 7/2008 | Matsumoto et al. | |
| 2008/0169886 A1 | 7/2008 | Kuroda | |
| 2008/0272853 A1 | 11/2008 | Heinze et al. | |
| 2008/0297278 A1 | 12/2008 | Handtmann et al. | |
| 2009/0096549 A1 | 4/2009 | Thalhammer et al. | |
| 2009/0096550 A1 | 4/2009 | Handtmann et al. | |
| 2010/0277237 A1 | 11/2010 | Sinha et al. | |
| 2011/0115334 A1 | 5/2011 | Konishi et al. | |
| 2011/0121689 A1 | 5/2011 | Grannen et al. | |
| 2011/0180391 A1 | 7/2011 | Larson, III et al. | |
| 2011/0204995 A1 | 8/2011 | Jamneala et al. | |
| 2011/0210787 A1 | 9/2011 | Lee et al. | |
| 2012/0007696 A1 | 1/2012 | Pang et al. | |
| 2012/0187799 A1 | 7/2012 | Nakahashi | |
| 2012/0313725 A1 | 12/2012 | Ueda et al. | |
| 2013/0033150 A1 | 2/2013 | Bardong et al. | |
| 2013/0106248 A1 | 5/2013 | Burak et al. | |
| 2013/0113576 A1 | 5/2013 | Inoue et al. | |
| 2013/0193808 A1 | 8/2013 | Feng et al. | |
| 2014/0085020 A1 | 3/2014 | Reinhardt et al. | |
| 2014/0125203 A1 | 5/2014 | Choy et al. | |
| 2014/0132117 A1 | 5/2014 | Larson, III | |
| 2014/0145557 A1 | 5/2014 | Tanaka | |
| 2014/0167565 A1 | 6/2014 | Iwamoto | |
| 2015/0054387 A1 | 2/2015 | Li | |
| 2015/0222246 A1 | 8/2015 | Nosaka | |
| 2015/0280100 A1 | 10/2015 | Burak et al. | |
| 2015/0369153 A1 | 12/2015 | Tsunooka et al. | |
| 2016/0028364 A1 | 1/2016 | Takeuchi | |
| 2016/0056789 A1 | 2/2016 | Otsubo et al. | |
| 2016/0142041 A1* | 5/2016 | Kuwahara | H03H 9/1085 |
| | | | 333/195 |
| 2016/0164487 A1 | 6/2016 | Shin et al. | |
| 2016/0191012 A1 | 6/2016 | Khlat et al. | |
| 2016/0191014 A1 | 6/2016 | Khlat et al. | |
| 2016/0191016 A1 | 6/2016 | Khlat et al. | |
| 2016/0218696 A1 | 7/2016 | Nosaka et al. | |
| 2016/0261235 A1 | 9/2016 | Ortiz | |
| 2016/0268998 A1 | 9/2016 | Xu et al. | |
| 2016/0308576 A1 | 10/2016 | Khlat et al. | |
| 2016/0359468 A1 | 12/2016 | Taniguchi et al. | |
| 2017/0093369 A1 | 3/2017 | Khlat et al. | |
| 2017/0093370 A1 | 3/2017 | Khlat et al. | |
| 2017/0141757 A1 | 5/2017 | Schmidhammer | |
| 2017/0201233 A1 | 7/2017 | Khlat | |
| 2017/0301992 A1 | 10/2017 | Khlat et al. | |
| 2017/0310302 A1 | 10/2017 | Bauder et al. | |
| 2017/0324159 A1 | 11/2017 | Khlat | |
| 2017/0338795 A1 | 11/2017 | Nakagawa et al. | |
| 2018/0013402 A1 | 1/2018 | Kirkpatrick et al. | |
| 2018/0041191 A1 | 2/2018 | Park | |
| 2018/0076793 A1 | 3/2018 | Khlat et al. | |
| 2018/0076794 A1 | 3/2018 | Khlat et al. | |
| 2018/0109236 A1 | 4/2018 | Konoma | |
| 2018/0109237 A1 | 4/2018 | Wasilik et al. | |
| 2018/0145658 A1 | 5/2018 | Saji | |
| 2018/0219530 A1 | 8/2018 | Khlat et al. | |
| 2018/0241418 A1 | 8/2018 | Takamine et al. | |
| 2018/0358947 A1 | 12/2018 | Mateu et al. | |
| 2019/0103851 A1 | 4/2019 | Yusuf | |
| 2019/0140618 A1 | 5/2019 | Takamine | |
| 2019/0181824 A1 | 6/2019 | Timme et al. | |
| 2019/0181835 A1 | 6/2019 | Timme et al. | |
| 2019/0199320 A1 | 6/2019 | Morita et al. | |
| 2019/0207583 A1 | 7/2019 | Miura et al. | |
| 2019/0222197 A1 | 7/2019 | Khlat et al. | |
| 2019/0288664 A1 | 9/2019 | Saji | |
| 2019/0305752 A1 | 10/2019 | Sadhu et al. | |
| 2020/0028479 A1 | 1/2020 | Ta et al. | |
| 2021/0028755 A1 | 1/2021 | Yusuf | |
| 2021/0194459 A1 | 6/2021 | Alavi et al. | |
| 2021/0211116 A1 | 7/2021 | Khlat | |
| 2021/0218385 A1 | 7/2021 | Yusuf et al. | |
| 2021/0218386 A1 | 7/2021 | Yusuf et al. | |
| 2021/0399750 A1 | 12/2021 | Varela Campelo | |
| 2022/0069800 A1 | 3/2022 | Han et al. | |
| 2022/0140817 A1 | 5/2022 | Kreuzer | |
| 2022/0231664 A1 | 7/2022 | Gimenez et al. | |
| 2023/0074812 A1 | 3/2023 | Almalkawi | |
| 2023/0246633 A1 | 8/2023 | Granger-Jones et al. | |

FOREIGN PATENT DOCUMENTS

| | | | |
|---|---|---|---|
| CN | 205666806 U | 10/2016 | |
| CN | 111010120 A | 4/2020 | |
| CN | 111917392 A | 11/2020 | |
| CN | 114026786 A | 2/2022 | |
| DE | 102015107569 A1 | 11/2015 | |
| FR | 3018969 A1 | 9/2015 | |
| JP | 2002251190 A | 9/2002 | |

(56) References Cited

FOREIGN PATENT DOCUMENTS

| | | | |
|---|---|---|---|
| JP | 2008085989 A | 4/2008 | |
| JP | 2011176744 A | 9/2011 | |
| JP | 2012257050 A | 12/2012 | |
| JP | 2015032634 A | 2/2015 | |
| JP | 2016504870 A | 2/2016 | |
| JP | 2016507939 A | 3/2016 | |
| JP | 2017045749 A | 3/2017 | |
| JP | 2017103654 A | 6/2017 | |
| JP | 2018093388 A | 6/2018 | |
| JP | 2020526471 A | 8/2020 | |
| WO | 2009132011 A2 | 10/2009 | |
| WO | 2014061351 A1 | 4/2014 | |
| WO | 2018047862 A1 | 3/2018 | |

OTHER PUBLICATIONS

Kreuzer, S. et al., "Full band 41 filter with high Wi-Fi rejection—design and manufacturing challenges," IEEE International Ultrasonics Symposium (IUS), Oct. 21-24, 2015, Taipei, Taiwan, IEEE, 4 pages.

Volatier, A. et al., "Technology enhancements for high performance BAW duplexer," IEEE International Ultrasonics Symposium (IUS), Jul. 21-25, 2013, Prague, Czech Republic, IEEE, pp. 761-764.

Non-Final Office Action for U.S. Appl. No. 16/740,667, mailed Mar. 4, 2021, 10 pages.

Non-Final Office Action for U.S. Appl. No. 16/776,738, mailed Mar. 4, 2021, 7 pages.

Non-Final Office Action for U.S. Appl. No. 16/806,166, mailed Mar. 18, 2021, 6 pages.

Larson, John, et al., "Characterization of Reversed c-axis AlN Thin Films," IEEE International Ultrasonics Symposium, San Diego, California, 2010, pp. 1054-1059.

Non-Final Office Action for U.S. Appl. No. 16/358,823, mailed Apr. 5, 2021, 12 pages.

Non-Final Office Action for U.S. Appl. No. 15/883,933, mailed Mar. 29, 2021, 11 pages.

Zverev, A., "Figure 8.25," Hanbook of Filter Synthesis, 1967, John Wiley & Sons, 4 pages.

Zverev, A., "The Synthesis of Intermediate Bandpass Filters," Hanbook of Filter Synthesis, 1967, John Wiley & Sons, pp. 483-488.

Notice of Allowance for U.S. Appl. No. 16/290,175, mailed Jun. 14, 2021, 7 pages.

Corrected Notice of Allowability for U.S. Appl. No. 16/290,175, mailed Jun. 23, 2021, 4 pages.

Notice of Allowance for U.S. Appl. No. 16/740,667, mailed Jun. 11, 2021, 7 pages.

Notice of Allowance for U.S. Appl. No. 16/776,738, mailed Jun. 11, 2021, 7 pages.

Notice of Allowance for U.S. Appl. No. 16/806,166, mailed Jun. 18, 2021, 7 pages.

Akoustis, "The Latest In WiFi 7 Filter Technology: A10655 And A10665," Akoustis Blog, Sep. 29, 2022, available online: [URL: https://akoustis.com/the-latest-in-wifi-7-filter-technology-a10655-and-a10665/?utm_source=everythingRF], 5 pages.

Hetting, C., "Akoustis: 'XBAW™' filters critical for full utilization of 5 GHz & 6 GHz Wi-Fi bands," Wi-Fi Now Golbal, May 6, 2022, available online: [URL: https://wifinowglobal.com/news-and-blog/akoustis-xbaw-filters-critical-for-full-utilization-of-5-ghz-6-ghz-wi-fi-bands/?mc_cid=af353ad165&mc_eid=2c2%E2%80%A6], 4 pages.

Moreira, M. et al., "Aluminum scandium nitride thin-film bulk acoustic resonators for wide band applications," Vacuum, vol. 86, Issue 1, Jul. 2011, Elsevier Ltd., 4 pages.

Notice of Allowance and Examiner-Initiated Interview Summary for U.S. Appl. No. 16/722,125, mailed Jun. 24, 2022, 10 pages.

Office Action for Japanese Patent Application No. 2018181230, mailed Sep. 14, 2022, 9 pages.

Decision to Grant for Japanese Patent Application No. 2018181230, mailed Apr. 13, 2023, 5 pages.

Notice of Preliminary Rejection for Korean Patent Application No. 1020180116185, mailed Dec. 23, 2023, 10 pages.

Reason for Rejection for Japanese Patent Application No. 2019058733, mailed Mar. 2, 2023, 14 pages.

Quayle Action for U.S. Appl. No. 17/141,678, mailed Mar. 21, 2023, 6 pages.

Non-Final Office Action for U.S. Appl. No. 17/088,872, mailed Aug. 29, 2022, 8 pages.

Notice of Allowance for U.S. Appl. No. 17/088,872, mailed Dec. 14, 2022, 7 pages.

Non-Final Office Action for U.S. Appl. No. 17/152,110, mailed May 27, 2022, 6 pages.

Notice of Allowance for U.S. Appl. No. 17/152,110, mailed Sep. 21, 2022, 7 pages.

Extended European Search Report for European Patent Application No. 22150239.6, mailed Jun. 9, 2022, 10 pages.

Iborra, E. et al., "Piezoelectric and Electroacoustic Properties of V-Doped and Ta-Doped AlN Thin Films," 2013 Joint European Frequency and Time Forum & International Frequency Control Symposium (EFTF/IFC), Jul. 21-25, 2013, Prague, Czech Republic, IEEE, pp. 262-265.

Decision on Registration for Korean Patent Application No. 1020180116185, mailed Jul. 12, 2024, 2 pages.

First Office Action for Chinese Patent Application No. 201910229019.6, mailed Aug. 1, 2024, 13 pages.

Notice of Allowance for U.S. Appl. No. 17/588,836, mailed Jul. 17, 2024, 8 pages.

Non-Final Office Action for U.S. Appl. No. 14/757,587, mailed Sep. 13, 2016, 12 pages.

Notice of Allowance for U.S. Appl. No. 14/757,587, mailed Mar. 9, 2017, 8 pages.

Non-Final Office Action for U.S. Appl. No. 15/004,084, mailed Jun. 12, 2017, 9 pages.

Non-Final Office Action for U.S. Appl. No. 14/757,651, mailed Jun. 9, 2017, 11 pages.

Non-Final Office Action for U.S. Appl. No. 15/275,957, mailed Jun. 14, 2017, 9 pages.

Ex Parte Quayle Action for U.S. Appl. No. 15/347,452, mailed Jun. 15, 2017, 7 pages.

Final Office Action for U.S. Appl. No. 15/275,957, mailed Jan. 2, 2018, 7 pages.

Author Unknown, "Saw Filters—SAW Resonators: Surface Acoustic Wave SAW Components," Product Specification, 2010, Token Electronics Industry Co., Ltd., 37 pages.

Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.

Kwa, Tom, "Wafer-Level Packaged Accelerometer With Solderable SMT Terminals," IEEE Sensors, Oct. 22-25, 2006, Daegu, South Korea, IEEE, pp. 1361-1364.

Lakin, K. M., "Coupled Resonator Filters," 2002 IEEE Ultrasonics Symposium, Oct. 8-11, 2002, Munich, Germany, 8 pages.

López, Edén Corrales, "Analysis and Design of Bulk Acoustic Wave Filters Based on Acoustically Coupled Resonators," PHD Thesis, Department of Telecommunications and Systems Engineering, Autonomous University of Barcelona, May 2011, 202 pages.

Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.

Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.

Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.

Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.

(56) References Cited

OTHER PUBLICATIONS

De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.

Lakin, K. M., "Bulk Acoustic Wave Coupled Resonator Filters," International Frequency Control Symposium, 2002, IEEE, pp. 8-14.

Shirakawa, A. A., et al., "Bulk Acoustic Wave Coupled Resonator Filters Synthesis Methodology," European Microwave Conference, Oct. 4-6, 2005, Paris, France, IEEE, 4 pages.

Tosic, Dejan, et al., "Symbolic analysis of immitance inverters," 14th Telecommunications Forum, Nov. 21-23, 2006, Belgrade, Serbia, pp. 584-487.

Non-Final Office Action for U.S. Appl. No. 14/757,651, mailed May 8, 2018, 8 pages.

Notice of Allowance for U.S. Appl. No. 15/347,428, mailed Jul. 12, 2018, 9 pages.

Notice of Allowance for U.S. Appl. No. 15/490,381, mailed May 23, 2018, 8 pages.

Final Office Action for U.S. Appl. No. 14/757,651, mailed Sep. 19, 2018, 7 pages.

Non-Final Office Action for U.S. Appl. No. 15/701,759, mailed Oct. 4, 2018, 10 pages.

Notice of Allowance for U.S. Appl. No. 15/727,117, mailed Mar. 13, 2019, 9 pages.

Non-Final Office Action for U.S. Appl. No. 15/586,374, mailed Feb. 26, 2019, 16 pages.

Notice of Allowance for U.S. Appl. No. 15/720,706, mailed Mar. 15, 2019, 9 pages.

Non-Final Office Action for U.S. Appl. No. 15/697,658, mailed May 1, 2019, 13 pages.

Larson, John, et al., "Characterization of Reversed c-axis AIN Thin Films," International Ultrasonics Symposium Proceedings, 2010, IEEE, pp. 1054-1059.

Notice of Allowance for U.S. Appl. No. 15/586,374, mailed Oct. 4, 2019, 7 pages.

Notice of Allowance for U.S. Appl. No. 15/644,922, mailed Oct. 21, 2019, 10 pages.

Final Office Action for U.S. Appl. No. 15/697,658, mailed Oct. 22, 2019, 9 pages.

Non-Final Office Action for U.S. Appl. No. 15/883,933, mailed Oct. 25, 2019, 19 pages.

Non-Final Office Action for U.S. Appl. No. 16/003,417, mailed Apr. 3, 2020, 9 pages.

Capilla, Jose et al., "High-Acoustic-Impedance Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.

Fattinger, Gernot et al., "Single-to-balanced Filters for Mobile Phones using Coupled Resonator BAW Technology," 2004 IEEE International Ultrasonics, Ferroelectrics, and Frequency Control Joint 50th Anniversary Conference, Aug. 23-27, 2004, IEEE, pp. 416-419.

Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.

Roy, Ambarish et al., "Spurious Modes Suppression in Stacked Crystal Filter," 2010 IEEE Long Island Systems, Applications and Technology Conference, May 7, 2010, 6 pages.

Non-Final Office Action for U.S. Appl. No. 16/290,175, mailed Apr. 14, 2020, 29 pages.

Ibrahim, A. et al., "Compact Size Microstrip Coupled Resonator Band Pass Filter Loaded with Lumped Capacitors," 2013 Second International Japan—Egypt Conference on Electronics, Communications and Computers (JEC-ECC), Dec. 17-19, 2013, Egypt, IEEE, 4 pages.

Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.

Zhu, L. et al., "Adjustable Bandwidth Filter Design Based on Interdigital Capacitors," IEEE Microwave and Wireless Components Letters, vol. 18, No. 1, Jan. 2008, IEEE, pp. 16-18.

Non-Final Office Action for U.S. Appl. No. 16/283,044, mailed Nov. 12, 2020, 9 pages.

Notice of Allowance for U.S. Appl. No. 15/697,658, mailed Nov. 17, 2020, 7 pages.

Final Office Action for U.S. Appl. No. 15/883,933, mailed Oct. 23, 2020, 15 pages.

Advisory Action for U.S. Appl. No. 15/883,933, mailed Dec. 31, 2020, 3 pages.

Notice of Allowance and Examiner-Initiated Interview Summary for U.S. Appl. No. 16/003,417, mailed Aug. 5, 2020, 9 pages.

Final Office Action for U.S. Appl. No. 16/290,175, mailed Sep. 17, 2020, 13 pages.

Non-Final Office Action for U.S. Appl. No. 16/290,175, mailed Jan. 6, 2021, 14 pages.

Notice of Preliminary Rejection for Korean Patent Application No. 1020190035987, mailed Mar. 26, 2024, 9 pages.

Notice of Allowance for U.S. Appl. No. 17/588,836, mailed May 8, 2024, 10 pages.

* cited by examiner

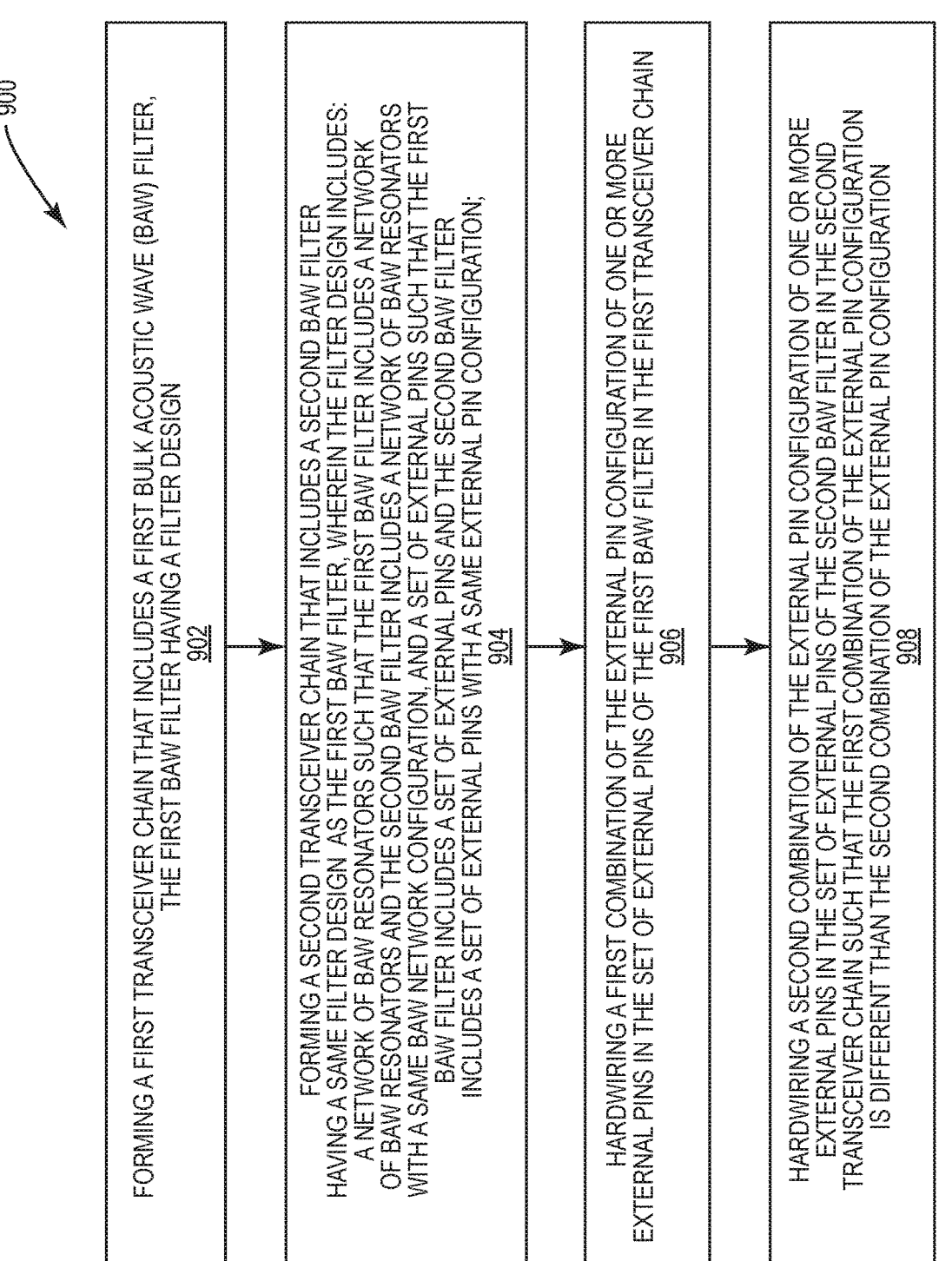

900

FORMING A FIRST TRANSCEIVER CHAIN THAT INCLUDES A FIRST BULK ACOUSTIC WAVE (BAW) FILTER, THE FIRST BAW FILTER HAVING A FILTER DESIGN
902

FORMING A SECOND TRANSCEIVER CHAIN THAT INCLUDES A SECOND BAW FILTER HAVING A SAME FILTER DESIGN AS THE FIRST BAW FILTER, WHEREIN THE FILTER DESIGN INCLUDES: A NETWORK OF BAW RESONATORS SUCH THAT THE FIRST BAW FILTER INCLUDES A NETWORK OF BAW RESONATORS AND THE SECOND BAW FILTER INCLUDES A NETWORK OF BAW RESONATORS WITH A SAME BAW NETWORK CONFIGURATION, AND A SET OF EXTERNAL PINS SUCH THAT THE FIRST BAW FILTER INCLUDES A SET OF EXTERNAL PINS AND THE SECOND BAW FILTER INCLUDES A SET OF EXTERNAL PINS WITH A SAME EXTERNAL PIN CONFIGURATION;
904

HARDWIRING A FIRST COMBINATION OF THE EXTERNAL PIN CONFIGURATION OF ONE OR MORE EXTERNAL PINS IN THE SET OF EXTERNAL PINS OF THE FIRST BAW FILTER IN THE FIRST TRANSCEIVER CHAIN
906

HARDWIRING A SECOND COMBINATION OF THE EXTERNAL PIN CONFIGURATION OF ONE OR MORE EXTERNAL PINS IN THE SET OF EXTERNAL PINS OF THE SECOND BAW FILTER IN THE SECOND TRANSCEIVER CHAIN SUCH THAT THE FIRST COMBINATION OF THE EXTERNAL PIN CONFIGURATION IS DIFFERENT THAN THE SECOND COMBINATION OF THE EXTERNAL PIN CONFIGURATION
908

*FIG. 9*

PIN RECONFIGURABLE BAW FILTERS

RELATED APPLICATIONS

This application claims the benefit of provisional patent application Ser. No. 63/452,202, filed Mar. 15, 2023, the disclosure of which is hereby incorporated herein by reference in its entirety.

FIELD OF THE DISCLOSURE

This disclosure relates generally to bulk acoustic wave (BAW) filters used in a radio frequency (RF) front-end circuitry.

BACKGROUND

Different transceiver chains in a radio frequency (RF) front-end circuitry operate in different frequency bands. Bulk acoustic wave (BAW) filters are often employed to filter noise and other unwanted spectral characteristics from the RF signals being transmitted in different transceiver chains. However, the BAW filters need to place their passband in the frequency band of the transceiver chain in operation. This not only requires that the passband pass the RF signal in the frequency band of operation, but also that the passband reject the frequency bands outside the frequency band of operation without introducing excessive insertion losses. Generally, switches are used so that the BAW filter shifts the passband accordingly. Unfortunately, switches introduce insertion losses. Furthermore, as the frequencies of operation have increased, it has become increasingly difficult to provide the passband so as to pass the RF signals in the frequency band of operation while maintaining adequate rejection in passbands outside the frequencies of operation.

SUMMARY

In some embodiments, a radio frequency (RF) front-end circuitry includes: a first transceiver chain that includes a first filter, a first bulk acoustic wave (BAW) filter having a filter design; a second transceiver chain that includes a second BAW filter having a same filter design as the first BAW filter, wherein the filter design includes: a network of BAW resonators such that the first BAW filter includes a network of BAW resonators and the second BAW filter includes a network of BAW resonators with a same BAW network configuration; a set of external pins such that the first BAW filter includes a set of external pins and the second BAW filter includes a set of external pins with a same external pin configuration; wherein a first combination of the external pin configuration of one or more external pins in the set of external pins of the first BAW filter is hardwired in the first transceiver chain; wherein a second combination of the external pin configuration of one or more external pins in the set of external pins of the second BAW filter is hardwired in the second transceiver chain such that the first combination of the external pin configuration is different than the second combination of the external pin configuration. In some embodiments, the RF front-end circuitry further includes: a third transceiver chain that includes a third BAW filter having the same filter design, wherein: the third BAW filter includes a network of BAW resonators with the same BAW network configuration; the third BAW filter includes a set of external pins with the same external pin configuration; a third combination of the external pin configuration of one or more external pins in the set of external pins of the third BAW filter is hardwired in the third transceiver chain; and the third combination is different than the first combination and the second combination. In some embodiments, the RF front-end circuitry further includes: a fourth transceiver chain that includes a fourth BAW filter having the same filter design, wherein: the fourth BAW filter includes a network of BAW resonators with the same BAW network configuration; the fourth BAW filter includes a set of external pins with the same external pin configuration; a fourth combination of the external pin configuration of one or more external pins in the set of external pins of the fourth BAW filter is hardwired in the fourth transceiver chain; and the fourth combination is different than the first combination, the second combination, and the third configuration. In some embodiments, the first BAW filter defines a first passband; the second BAW filter defines a second passband, wherein the second passband is shifted with respect to the first passband as a result of the first combination being different than the second combination. In some embodiments, the network of BAW resonators in the filter design defines a first input path with a first BAW resonator and a second input path with a second BAW resonator such that: the network of BAW resonators in the first BAW filter includes a first input path with a first BAW resonator and a second input path with a second BAW resonator; the network of BAW resonators in the first BAW filter includes a first input path with a first BAW resonator and a second input path with a second BAW resonator; the first input path of the first BAW filter is hardwired in the first transceiver chain and the second input path of the first BAW filter is unconnected; and the first input path of the second BAW filter is unconnected and the second input path of the second BAW filter is hardwired in the second transceiver chain.

In some embodiments, the network of BAW resonators in the filter design defines a first input path with a first BAW resonator and a second input path with a second BAW resonator such that: the network of BAW resonators in the first BAW filter includes a first input path with a first BAW resonator and a second input path with a second BAW resonator; the network of BAW resonators in the first BAW filter includes a first input path with a first BAW resonator and a second input path with a second BAW resonator; the first input path of the first BAW filter is hardwired in the first transceiver chain and the second input path of the first BAW filter is unconnected; and the first input path of the second BAW filter is unconnected and the second input path of the second BAW filter is hardwired in the second transceiver chain. In some embodiments, the first BAW filter defines a first passband having a first low corner frequency; the second BAW filter defines a second passband having a second low corner frequency; and wherein the first low corner frequency is shifted with respect to the second low corner frequency. In some embodiments, the network of BAW resonators in the filter design defines a first output path with a first BAW resonator and a second output path with a second BAW resonator such that: the network of BAW resonators in the first BAW filter include a first output path with a first BAW resonator and a second output path with a second BAW resonator; the network of BAW resonators in the first BAW filter include a first output path with a first BAW resonator and a second output path with a second BAW resonator; the first output path of the first BAW filter is hardwired in the first transceiver chain and the second output path of the first BAW filter is unconnected; and the first output path of the second BAW filter is unconnected and the second output path of the second BAW filter is hardwired in the second transceiver chain. In some embodiments, the first BAW filter defines a first passband having a first high corner frequency; the second BAW filter defines a second passband having a second high corner frequency; and wherein the first high corner frequency is shifted with respect to the second high corner frequency. In some embodiments, the network of BAW resonators in the filter design defines a first ground path with a first BAW resonator and a second ground path with a second BAW resonator such that: the network of BAW resonators in the first BAW filter includes a first ground path with a first BAW resonator and a second ground path with a second BAW resonator; the network of BAW resonators in the first BAW filter includes a first ground path with a first BAW resonator and a second ground path with a second BAW resonator; the first ground path of the first BAW filter is hardwired in the first transceiver chain and the second ground path of the first BAW filter is unconnected; and the first ground path of the second BAW filter is unconnected and the second ground path of the second BAW filter is hardwired in the second transceiver chain. In some embodiments, no switch is connected directly to any of the pins in the set of external pins of the first BAW filter and no switch is connected directly to any of the pins in the set of external pins of the second BAW filter.

In some embodiments, an RF front-end circuitry includes: a first transceiver chain that includes a first BAW filter, the first BAW filter having a filter design defining a set of external pins; a second transceiver chain that includes a second BAW filter, the second BAW filter having the filter design and thus also defining a set of external pins; wherein a first combination of one or more pins in the set of external pins of the first BAW filter are hardwired in the first transceiver chain; wherein a second combination of one or more pins in the set of external pins of the second BAW filter are hardwired in the second transceiver chain; and wherein the first combination is different than the second combination. In some embodiments, the RF front-end circuitry further includes: a third transceiver chain that includes a third BAW filter having the same filter design defining a set of external pins, wherein: a third combination of one or more pins in the set of external pins of the third BAW filter are hardwired in the third transceiver chain; the third combination is different than the first combination and the second combination. In some embodiments, the RF front-end circuitry further includes: a fourth transceiver chain that includes a fourth BAW filter having the same filter design defining a set of external pins, wherein: a fourth combination of one or more pins in the set of external pins of the fourth BAW filter are hardwired in the third transceiver chain, the fourth combination is different than the first combination, the second combination, and the third combination. In some embodiments, the first BAW filter defines a first passband having a first low corner frequency; the second BAW filter defines a second passband having a second low corner frequency; wherein the first low corner frequency is shifted with respect to the second low corner frequency. In some embodiments, the first BAW filter defines a first passband having a first high corner frequency; the second BAW filter defines a second passband having a second high corner frequency; and wherein the first high corner frequency is shifted with respect to the second high corner frequency. In some embodiments, no switch is connected directly to any of the pins in the set of external pins of the first BAW filter and no switch is connected directly to any of the pins in the set of external pins of the second BAW filter. In some embodiments, the first BAW filter defines a passband in Unlicensed National Information Infrastructure band 4. In some embodiments, the first BAW filter defines a passband in Unlicensed National Information Infrastructure band 5. In some embodiments, the first RF transceiver chain includes first upstream circuitry connected to one or more of the set of external pins of the first BAW filter; the second RF transceiver chain includes second upstream circuitry connected to one or more of the set of external pins of the second BAW filter. In some embodiments, the first RF transceiver chain includes first downstream circuitry connected to one or more of the set of external pins of the first BAW filter; the second RF transceiver chain includes second downstream circuitry connected to one or more of the set of external pins of the second BAW filter.

In some embodiments, a method of manufacturing RF front-end circuitry includes: forming a first transceiver chain that includes a first BAW filter, the first BAW filter having a filter design; forming a first transceiver chain that includes a first BAW filter, the first BAW filter having a filter design; hardwiring a first combination of the external pin configuration of one or more external pins in the set of external pins of the first BAW filter in the first transceiver chain; and hardwiring a second combination of the external pin configuration of one or more external pins in the set of external pins of the second BAW filter in the second transceiver chain such that the first combination of the external pin configuration is different than the second combination of the external pin configuration.

In some embodiments, a user element includes RF front-end circuitry, the RF front-end circuitry includes: a first transceiver chain that includes a first BAW filter, the first BAW filter having a filter design; a second transceiver chain that includes a second BAW filter having a same filter design as the first BAW filter, wherein the filter design includes: a network of BAW resonators such that the first BAW filter includes a network of BAW resonators and the second BAW filter includes a network of BAW resonators with a same BAW network configuration; a set of external pins such that the first BAW filter includes a set of external pins and the second BAW filter includes a set of external pins with a same external pin configuration; wherein a first combination of the external pin configuration of one or more external pins in the set of external pins of the first BAW filter is hardwired in the first transceiver chain; and wherein a second combination of the external pin configuration of one or more external pins in the set of external pins of the second BAW filter is hardwired in the second transceiver chain such that the first combination of the external pin configuration is different than the second combination of the external pin configuration.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 9 is a flow diagram that illustrates a method of manufacturing RF front-end circuitry, in accordance with some embodiments.

DETAILED DESCRIPTION

Figure 1:
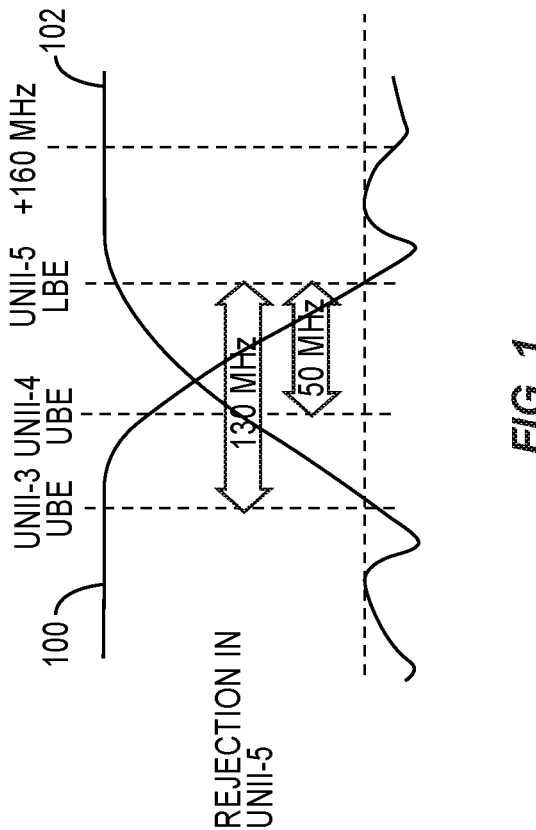
FIG. 1 is graph of passbands used in current front-end circuitry, in accordance with some embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 is graph of passbands 100, 102 used in current front-end circuitry, in accordance with some embodiments. The passband 100 is provided by a bulk acoustic wave (BAW) filter, in accordance with some embodiments. In particular, the passband 100 is provided by the BAW filter within Unlicensed National Information Infrastructure (UNII) band 3. In particular, the passband 102 is provided by the BAW filter within UNII band 5. The upper corner of the passband 100 and the low corner of the passband 102 are 130 MHz apart and, thus, the rejection region between the passband 100 and the passband 102 is 130 MHz wide. The narrow frequency gap between UNII band 4 and UNII band 5 is only 50 MHz and is too narrow for the current BAW filter technologies in one BAW filter to provide filtering for Wi-Fi front-ends in a cost effective manner. The overlay of the passbands 100, 102 shows that, in order to get sufficient rejection in UNII band 5, the upper band edge corner of the passband 102 must be moved downward in frequency and, as a consequence, the insertion loss in UNII band 4 is much too high. In fact, highly stable BAW technology has a+/−20 to 25 MHz variation for process and temperature, so no headroom is left for Q factor specifications.

Figure 2:
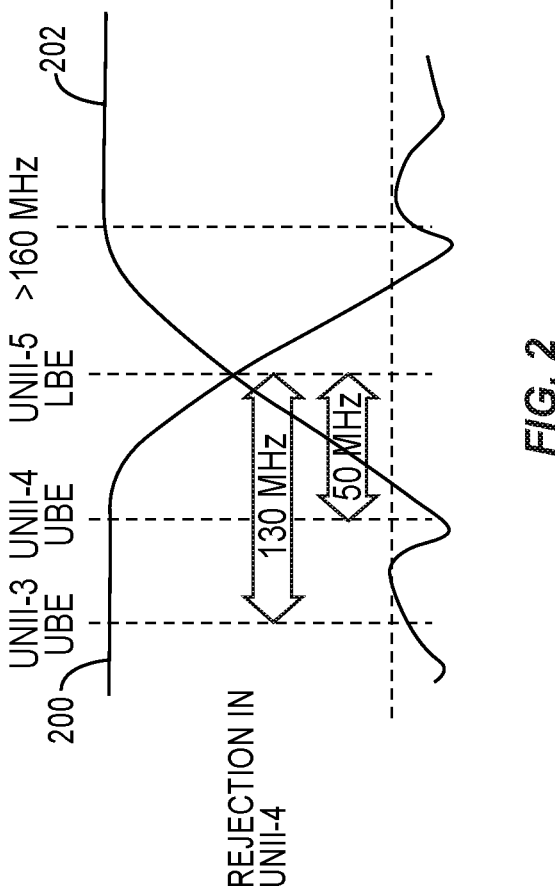
FIG. 2 is graph of passbands used in current front-end circuitry, in accordance with some embodiments.

FIG. 2 is graph of passbands 200, 202 used in current front-end circuitry, in accordance with some embodiments. In particular, the passband 200 is provided by the BAW filter is provided within UNII band 4. In particular, the passband 200 is provided by the BAW filter is provided within UNII band 5. The lower band edge of the passband 202 is moved upward in frequency to provide enough rejection in the UNII band 4. This results in excessively high insertion losses in the UNII band 5.

As a result, the filter requirements exceed what conventional BAW technology can do in one BAW filter. The solution has been to provide a reconfigurable BAW filter where switches are used to reconfigure the BAW configuration depending on the frequency band that is being used (e.g. UNII band 4 and UNII band 5). However, switches result in higher insertions losses. Furthermore, switches require control circuitry that implement complicated control techniques in order to switch the reconfigurable BAW filter depending on the frequency band that is being used.

Figure 3:
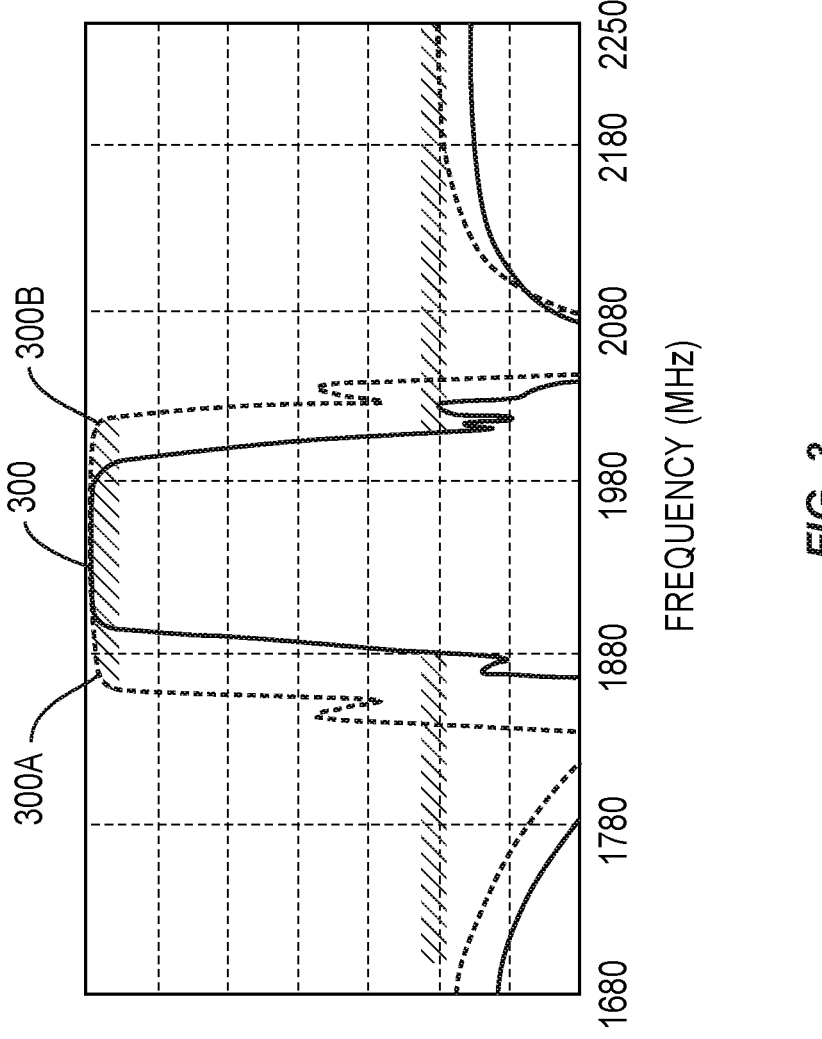
FIG. 3 is a passband, in accordance with some embodiments.

FIG. 3 is a passband 300 in accordance with some embodiments.

The passband 300 is produced by a BAW filter, which may be one of BAW filters 400-700 described in FIG. 4-FIG. 7 below. It should be noted that while the examples discussed herein related to the UNII-4 and the UNII-5 frequency bands, the BAW filters 400-700 described in FIG. 4-FIG. 7 may be utilized any time a passband 300 is to be placed.

As explained in FIG. 4-FIG. 7 below, the BAW filters 400-700 are configurable so that the passband 300 is placed in the UNII-4 band as shown by a passband 300A. The BAW filters 400-700 are configurable so that the passband 300 is placed in the UNII-5 band as shown by a passband 300B. More specifically, by selecting how to hardwire the BAW filters 400-700, the passband 300A is either placed in the UNII-4 band or is placed in the UNII-5 band. The term "hardwired" in this disclosure indicates that the connection is permanent and non-selective. For example, a hardwire connection can be made through a conductive trace or a wirebond, with no intermediary switches placed between the components being connected.

With respect to the passband 300A, the passband 300A has shifted the low corner frequency of the passband 300 so that the passband 300A is placed well into the UNII-4 band but has high rejection in the UNII-5 band. The passband 300A also introduces reduced insertion losses since no switches were utilized.

With respect to the passband 300B, the passband 300B has shifted the high corner frequency of the passband 300 so that the passband 300B is placed well into the UNII-5 band but has high rejection in the UNII-4 band. The passband 300B also introduces reduced insertion losses since no switches were utilized.

The BAW filters 400-700 described below provide an optimized solution that avoids sacrificing channels and doesn't need switches, so the configurations are passive. Instead of utilizing switches, one of the BAW filters 400-700 is provided for each different transceiver chain in front-end circuitry. The BAW filters 400-700 in each of the different transceiver chains are hardwired to provide the passband or rejection bands as required by the particular transceiver chain. Furthermore, the same type of BAW filters 400-700 may be used for each of the transceiver chains with only the hardwire configurations of the particular BAW filters 400-700 being different in each of the transceiver chains. While more individual BAW filters 400-700 are used in the transceiver chain (since a BAW filter is not reconfigured to be used with multiple transceiver chains during operation), no control circuitry or switching circuitry has to be used. Additionally, since the same type of BAW filters 400-700 may be used with each of the transceiver chains, the manufacturing of the front-end circuitry is simplified as different BAW filters do not need to be sorted and placed in different transceiver chains. Instead, the same type of BAW filter with the same internal configuration is placed in each of the transceiver chains with only the hardwire configuration of the BAW filter differing between the transceiver chains of the front-end circuitry.

Figure 4:
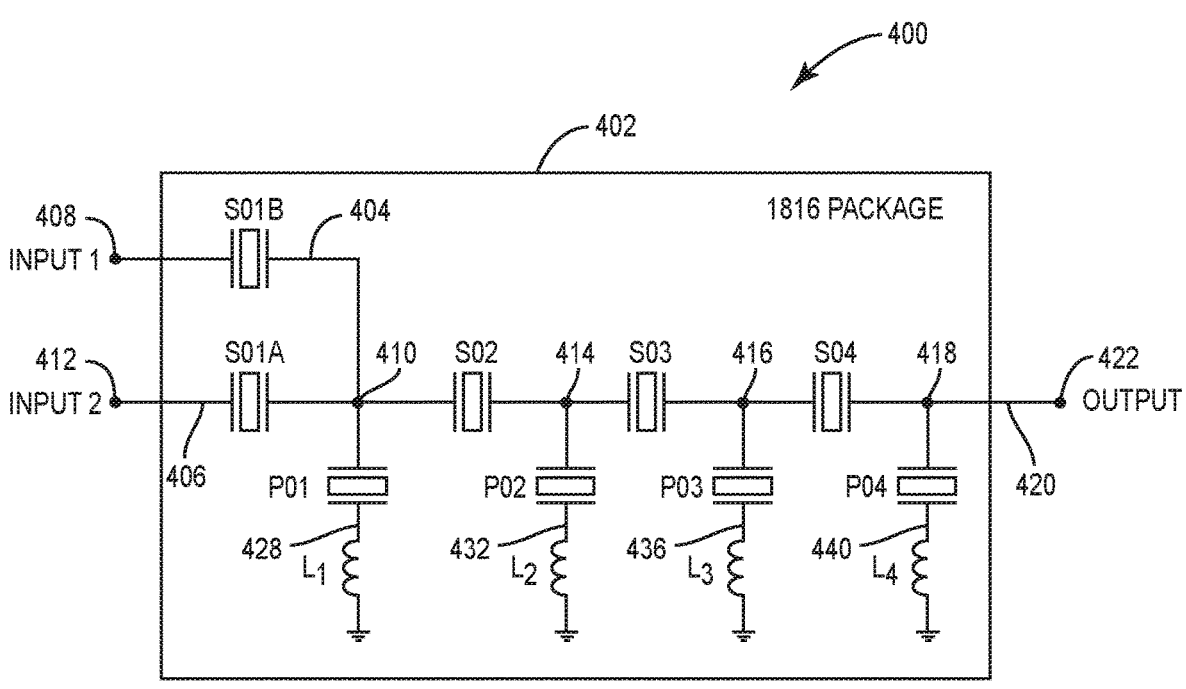
FIG. 4 is an embodiment of a bulk acoustic wave (BAW) filter, in accordance with some embodiments.

FIG. 4 is an embodiment of a BAW filter 400, in accordance with some embodiments.

The BAW filter 400 includes a network of BAW resonators S01A, S01B, S02, S03, S04, P01, P02, P03, P04. The BAW filter 400 further includes inductors L1, L2, L3, L4. The BAW filter 400 is provided in an integrated circuit (IC) package 402.

The filter design of the BAW filter 400 includes an input path 404 and an input path 406. The input path 404 is connected between an input node 408 (i.e., Input 1) and a node 410. The BAW resonator S01B is connected in series between the input node 408 and the node 410. It should be noted that input node 408 is provided as an input pin of the IC package 402.

The input path 406 is connected between an input node 412 (i.e., Input 2) and the node 410. The BAW resonator S01A is connected in series between the input node 412 and the node 410. It should be noted that input node 412 is provided as the input pin of the IC package 402.

The BAW resonator S02 is connected in series between the node 410 and a node 414. The BAW resonator S03 is connected in series between the node 414 and a node 416. The BAW resonator S04 is connected in series between the node 416 and a node 418. An output path 420 is connected between the node 418 and an output node 422. In some embodiments, the output node 422 is provided by an output pin of the IC package 402. In this disclosure, the BAW filters, such as the BAW filter 400, may be part of a transceiver chain. In a transceiver chain, energy may flow in both directions, which is why FIG. 4 may be from the left to the right of the BAW filter 400 or from the right to the left. In general, the input is referred to as the starting side for the flow of energy in the highest power mode (i.e., transmit mode and receive mode). In general, the highest power mode is the transmit mode and, thus, in general, the inputs (e.g., 408, 412) are connected on the side of a power amplifier while the output (e.g., 422) is connected to the antenna side.

A shunt path 428 is connected between the node 410 and ground. The BAW resonator P01 and the inductor L1 are connected in series in the shunt path 428 between the node 410 and ground. A shunt path 432 is connected between the node 414 and ground. The BAW resonator P02 and the inductor L2 are connected in series in the shunt path 432 between the node 414 and ground. A shunt path 436 is connected between the node 416 and ground. The BAW resonator P03 and the inductor L3 are connected in series in the shunt path 436 between the node 416 and ground. A shunt path 440 is connected between the node 418 and ground. The BAW resonator P04 and the inductor L4 are connected in series in the shunt path 440 between the node 418 and ground.

In this embodiment, either the input node 408 is hardwired to the front-end circuitry while the input node 412 is left unconnected to the front-end circuitry or the input node 412 is hardwired to the front-end circuitry while the input node 408 is left unconnected to the front-end circuitry. By hardwiring one of the input nodes 408, 412 to the front-end circuitry while leaving the other input node 412, 408 unconnected, the low corner frequency of the passband 300 in FIG. 3 is selected. More specifically, the BAW resonator S01A and the BAW resonator S01B have different resonant frequencies. Thus, by hardwiring one input node 408, 412 and leaving the other input node 412, 408 unconnected, the low corner frequency of the BAW filter 400 is selected.

Figure 5:
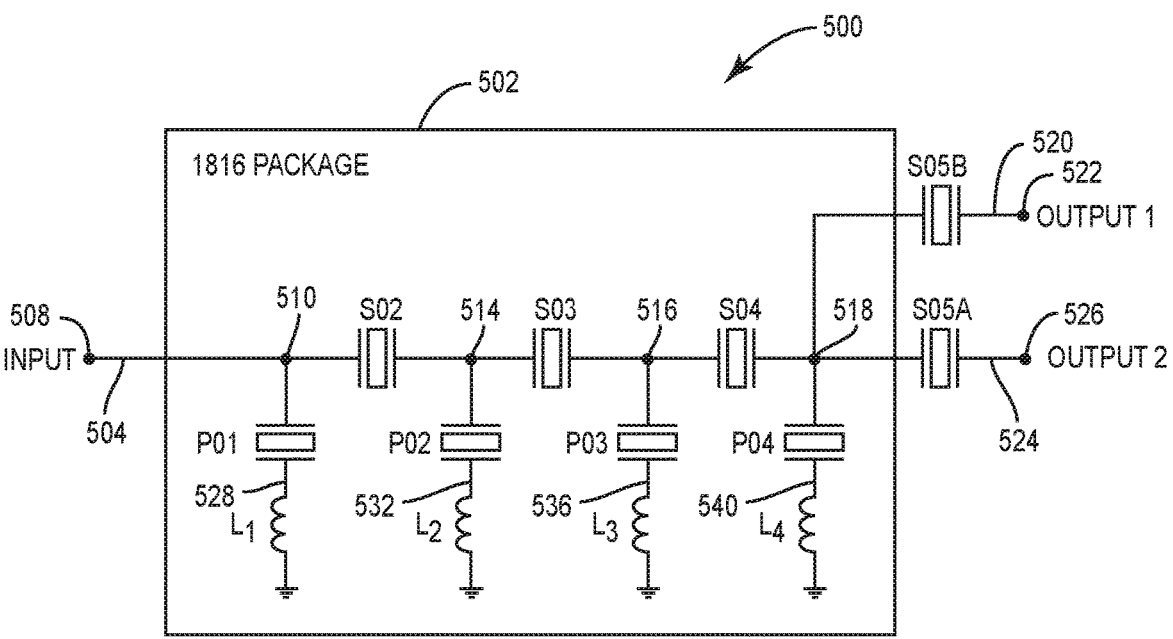
FIG. 5 is an embodiment of a BAW filter, in accordance with some embodiments.

FIG. 5 is an embodiment of a BAW filter 500, in accordance with some embodiments.

The filter design of the BAW filter 500 includes an input path 504. The input path 504 is connected between an input node 508 and a node 510. In some embodiments, the input node 508 is provided by an input pin of the IC package 502.

The BAW resonator S02 is connected in series between the node 510 and a node 514. The BAW resonator S03 is connected in series between the node 514 and a node 516. The BAW resonator S04 is connected in series between the node 516 and a node 518.

A shunt path 528 is connected between the node 510 and ground. The BAW resonator P01 and the inductor L1 are connected in series in the shunt path 528 between the node 510 and ground. A shunt path 532 is connected between the node 514 and ground. The BAW resonator P02 and the inductor L2 are connected in series in the shunt path 532 between the node 514 and ground. A shunt path 536 is connected between the node 516 and ground. The BAW resonator P03 and the inductor L3 are connected in series in the shunt path 536 between the node 516 and ground. A shunt path 540 is connected between the node 518 and ground. The BAW resonator P04 and the inductor L4 are connected in series in the shunt path 540 between the node 518 and ground.

An output path 520 is connected between the node 518 and an output node 522 (i.e., Output 1). The BAW resonator S05B is connected in series between the node 518 and the node 522. It should be noted that the node 518 is provided as an output pin of the IC package 502. The BAW resonator S05B is connected in series between the node 518 and the output node 522.

An output path 524 is connected between the node 518 and an output node 526 (i.e., Output 2). The BAW resonator S05A is connected in series between the node 518 and the output node 526. It should be noted that output node 526 is provided as an output pin of the IC package 502. The BAW resonator S05A is connected in series between the node 518 and the output node 526.

In this embodiment, either the output node 522 is hardwired to the front-end circuitry while the output node 526 is left unconnected to the front-end circuitry or the output node 526 is hardwired to the front-end circuitry while the output node 522 is left unconnected to the front-end circuitry. By hardwiring one of the output nodes 522, 526 to the front-end circuitry while leaving the other output node 526, 522 unconnected, the high corner frequency of the passband 300 in FIG. 3 is selected. More specifically, the BAW resonator S05A and the BAW resonator S05B have different resonant frequencies. Thus, by hardwiring one of the input nodes 522, 526 and leaving the other output node 526, 522 unconnected, the high corner frequency of the BAW filter 500 is selected.

Figure 6:
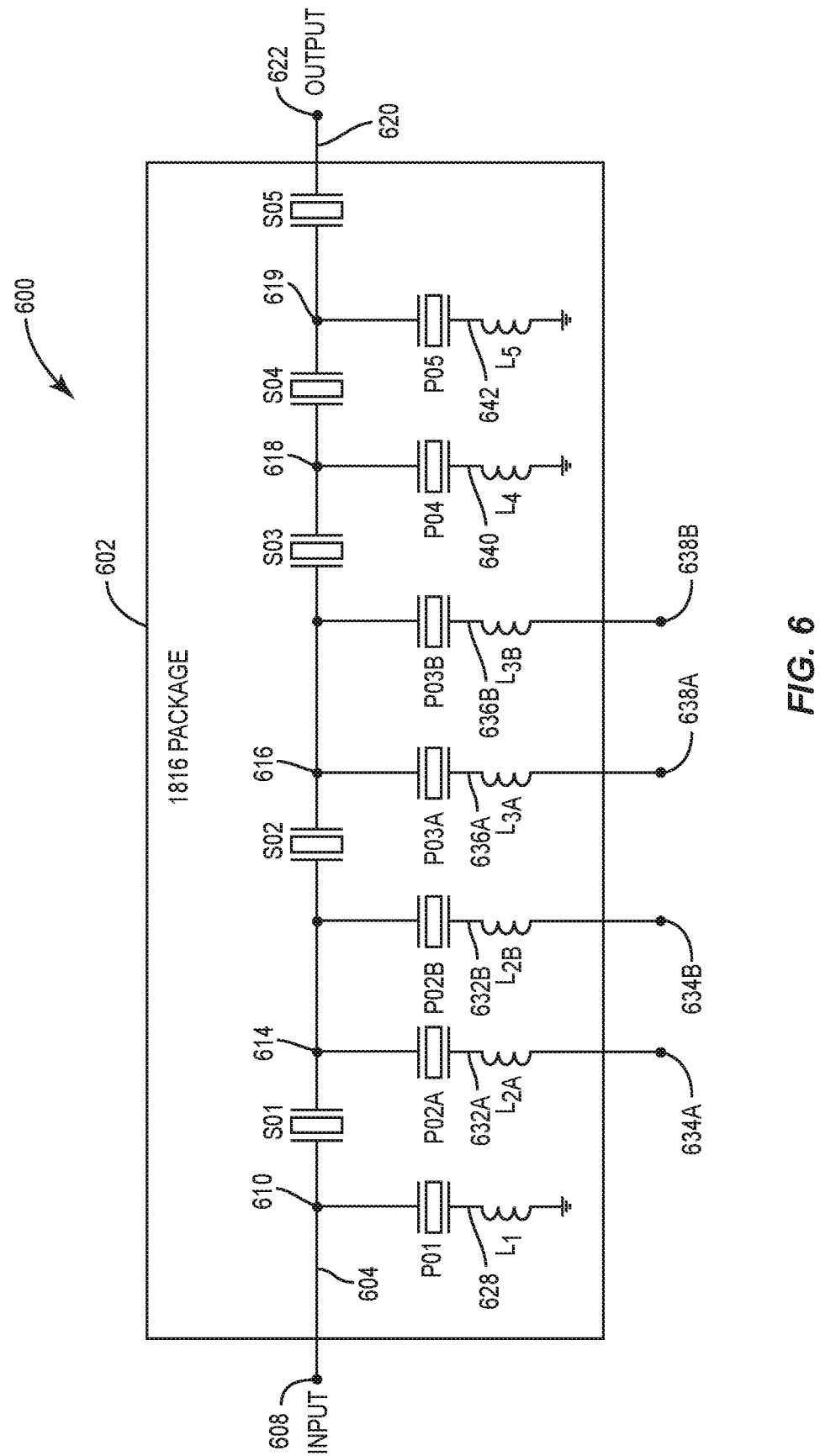
FIG. 6 is an embodiment of a BAW filter, in accordance with some embodiments.

FIG. 6 is an embodiment of a BAW filter 600, in accordance with some embodiments.

The BAW filter 600 includes a network of BAW resonators S01, S02, S03, S04, S05, P01, P02A, P02B, P03A, P03B, P04, P05. The BAW filter 600 further includes inductors L1, L2A, L2B, L3A, L3B, L4, L5. The BAW filter 600 is provided in an IC package 602.

The filter design of the BAW filter 600 includes an input path 604. The input path 604 is connected between an input node 608 and a node 610. In some embodiments, the input node 608 is provided by an input pin of the IC package 602.

The BAW resonator S01 is connected in series between the node 610 and a node 614. The BAW resonator S02 is connected in series between the node 614 and a node 616. The BAW resonator S03 is connected in series between the node 616 and the node 618. The BAW resonator S04 is connected in series between a node 618 and a node 619. The BAW resonator S05 is connected in series within an output path 620. The output path 620 is connected between the node 619 and an output node 622. In some embodiments, the output node 622 is an output pin of the IC package 602.

A shunt path 628 is connected between the node 610 and ground. The BAW resonator P01 and the inductor L1 are connected in series in the shunt path 628 between the node 610 and ground.

A shunt path 632A is connected between the node 614 and a ground node 634A. In some embodiments, the ground node 634A is a ground pin of the IC package 602. The shunt path 632A includes the BAW resonator P02A connected in series with the inductor L2A. In some embodiments, the ground node 634A is hardwired to ground so that the shunt path 632A shifts the passband 300 of the BAW filter 600. In some embodiments, the ground node 634A is left unconnected and, thus, the shunt path 632A does not affect the passband 300 of the BAW filter 600. In some embodiments, by selecting which of shunts paths 632A, 632B, 636A, 636B is hardwired to ground, the lower band edge of the BAW filter 600 is selected.

A shunt path 632B is connected between the node 614 and a ground node 634B. In some embodiments, the ground node 634B is a ground pin of the IC package 602. The shunt path 632B includes the BAW resonator P02B connected in series with the inductor L2B. In some embodiments, the ground node 634B is hardwired to ground so that the shunt path 632B shifts the passband 300 of the BAW filter 600. In some embodiments, the ground node 634B is left unconnected and, thus, the shunt path 632B does not affect the passband 300 of the BAW filter 600.

A shunt path 636A is connected between the node 616 and a ground node 638A. In some embodiments, the ground node 638A is a ground pin of the IC package 602. The shunt path 636A includes the BAW resonator P03A connected in series with the inductor L3A. In some embodiments, the ground node 638A is hardwired to ground so that the shunt path 636A shifts the passband 300 of the BAW filter 600. In some embodiments, the ground node 638A is left unconnected and, thus, the shunt path 636A does not affect the passband 300 of the BAW filter 600.

A shunt path 636B is connected between the node 616 and a ground node 638B. In some embodiments, the ground node 638B is a ground pin of the IC package 602. The shunt path 636B includes the BAW resonator P03B connected in series with the inductor L3B. In some embodiments, the ground node 638B is hardwired to ground so that the shunt path 636B shifts the passband 300 of the BAW filter 600. In some embodiments, the ground node 638B is left unconnected and thus the node 616 is left floating.

In some embodiments, the inductance values of each of the inductors L2A, L2B, L3A, L3B are the same. In some embodiments, each of the inductance values of the inductors L2A, L2B, L3A, L3B is small (e.g., less than or equal to 2 nH). In some embodiments, the inductor L2A, L2B, L3A, L3B are printed inductors used to fine tune the resonant frequencies of the resonators P02A, P02B, P03A, P03B.

A shunt path 640 is connected between the node 618 and ground. The BAW resonator P04 and the inductor L4 are connected in series in the shunt path 640 between the node 618 and ground. A shunt path 642 is connected between the node 619 and ground. The BAW resonator P05 and the inductor L5 are connected in series in the shunt path 642 between the node 619 and ground.

In this embodiment, one or more of the ground nodes 634A, 634B, 638A, 638B are hardwired to ground. By hardwiring one of the ground nodes 634A, 634B, 638A, 638B to ground while leaving the other ground nodes 634A, 634B, 638A, 638B unconnected, the corner frequencies of the passband 300 in FIG. 3 are selected. More specifically, the BAW resonators P02A, P02B, P03A, P03B have different resonant frequencies. Thus, by hardwiring a subset of the ground nodes 634A, 634B, 638A, 638B and leaving the other ground nodes 634A, 634B, 638A, 638B unconnected, the corner frequencies of the BAW filter 600 are selected.

Figure 7:
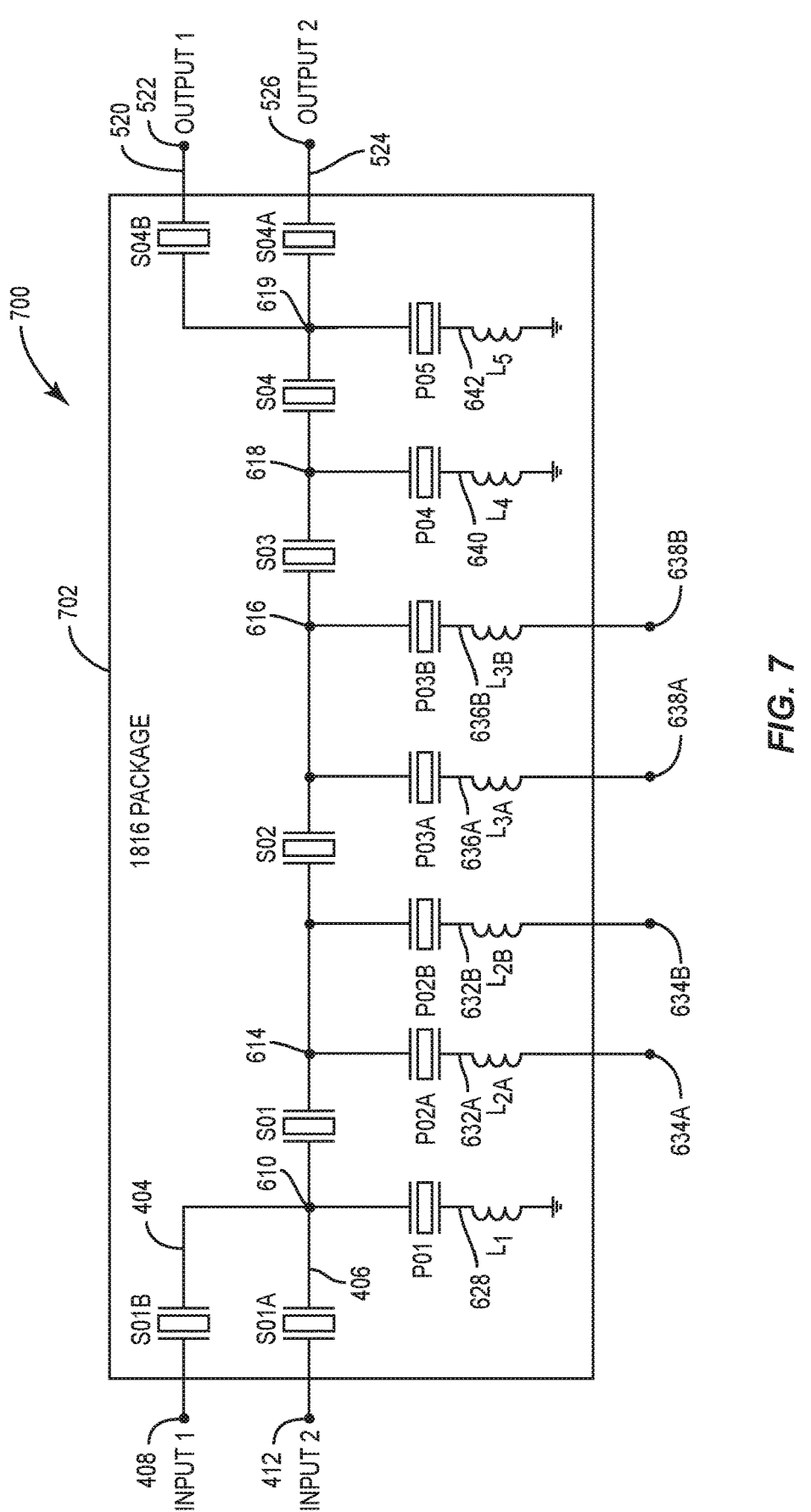
FIG. 7 is an embodiment of a BAW filter, in accordance with some embodiments.

FIG. 7 is an embodiment of a BAW filter 700, in accordance with some embodiments.

The BAW filter 700 includes a network of BAW resonators S01, S01A, S01B, S02, S03, S04, S05, P01, P02A, P02B, P03A, P03B, P04, P05, S04A, S04B. The BAW filter 700 further includes inductors L1, L2A, L2B, L3A, L3B, L4, L5. The BAW filter 700 is provided in an IC package 702.

BAW resonators S01, S02, S03, S04, S05, P01, P02A, P02B, P03A, P03B, P04, P05, and inductors L1, L2A, L2B, L3A, L3B, L4, L5 are arranged in the same manner as described above with respect to FIG. 6. Thus, the BAW filter 700 includes the shunt paths 632A, 632B, 636A, 636B with the ground nodes 634A, 634B, 638A, 638B that can either be hardwired to ground or left unconnected, as described above with respect to FIG. 6. In this embodiment, the BAW filter 700 further includes the input paths 404, 406 described in FIG. 4, wherein the node 610 corresponds with the node 410 of FIG. 4. The input nodes 408, 412 can either be hardwired to ground or left unconnected, as described above with respect to FIG. 4. In this embodiment, the BAW filter 700 further includes the output paths 520, 524 described in FIG. 5, wherein the node 619 corresponds with the node 518 of FIG. 5. The output nodes 522, 526 can either be hardwired to ground or left unconnected, as described above with respect to FIG. 5.

As such, the low corner frequency and the high corner frequency of the passband 300 of the BAW filter 700 are placed by determining which of the nodes 408, 412, 522, 526, 634A, 634B, 638A, 638B is hardwired and which of the nodes 408, 412, 522, 526, 634A, 634B, 638A, 638B are left unconnected. In this manner, the passband 300 is placed to pass the appropriate radio frequency (RF) signals while rejecting RF signals outside of the passband 300. The BAW filter 700 does this without introducing the insertion losses of RF switches or complicated control circuitry. Furthermore, a BAW filter with the same filter design as the BAW filter 700 can be used in different transceiver chains.

Figure 8:
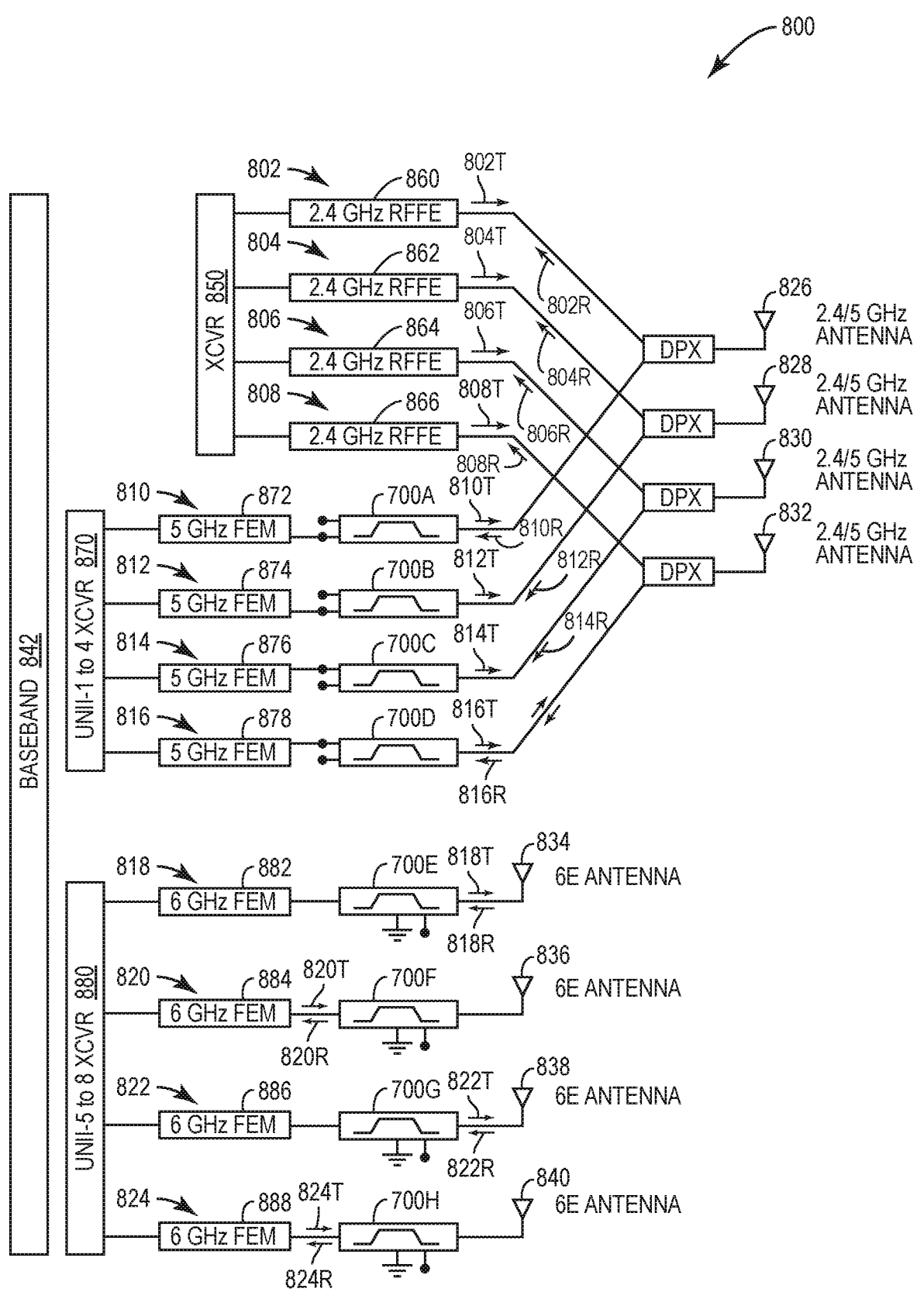
FIG. 8 is an embodiment of a radio frequency (RF) front-end circuitry, in accordance with some embodiments.

FIG. 8 is an embodiment of an RF front-end circuitry 800, in accordance with some embodiments.

The RF front-end circuitry 800 includes various transceiver chains 802, 804, 806, 808, 810, 812, 814, 816, 818, 820, 822, 824. Each of the transceiver chains is configured to generate an RF signal 802T, 804T, 806T, 808T, 810T, 812T, 814T, 816T, 818T, 820T, 822T, 824T, in an RF frequency band and a transmit RF signal 802T, 804T, 806T, 808T, 810T, 812T, 814T, 816T, 818T, 820T, 822T, 824T via one or more antennas 826, 828, 830, 832, 834, 836, 838, 840. Furthermore, each of the transceiver chains 802, 804, 806, 808, 810, 812, 814, 816, 818, 820, 822, 824 is configured to receive an RF signal 802R, 804R, 806R, 808R, 810R, 812R, 814R, 816R, 818R, 820R, 822R, 824R from the antenna 826, 828, 830, 832, 834, 836, 838, 840 and down convert the RF signals 802R, 804R, 806R, 808R, 810R, 812R, 814R, 816R, 818R, 820R, 822R, 824R into a baseband frequency.

The RF front-end circuitry 800 includes a baseband circuitry 842 that is configured to receive the down converted RF signals 802R, 804R, 806R, 808R, 810R, 812R, 814R, 816R, 818R, 820R, 822R, 824R from the transceiver chains 802, 804, 806, 808, 810, 812, 814, 816, 818, 820, 822, 824 and demodulate the down converted RF signals 802R, 804R, 806R, 808R, 810R, 812R, 814R, 816R, 818R, 820R, 822R, 824R in order to extract data. The extracted data is then transmitted to other processing circuitry (e.g., a signal processor). The baseband circuitry 842 is also configured to generate the RF signals 802T, 804T, 806T, 808T, 810T, 812T, 814T, 816T, 818T, 820T, 822T, 824T at baseband wherein the RF transceiver chains 802, 804, 806, 808, 810, 812, 814, 816, 818, 820, 822, 824 upconvert the RF signals 802T, 804T, 806T, 808T, 810T, 812T, 814T, 816T, 818T, 820T, 822T, 824T into the appropriate RF signals 802T, 804T, 806T, 808T, 810T, 812T, 814T, 816T, 818T, 820T, 822T, 824T, which are transmitted through one or more of the antennas.

The RF transceiver chains 802, 804, 806, 808 share XCVR upconversion/downconversion (U/D) circuitry 850. The XCVR U/D circuitry 850 is configured to upconvert RF signals 802T, 804T, 806T, 808T into a XCVR band. The XCVR band is different for each of the RF signals 802T, 804T, 806T, 808T. The RF transceiver chains 802, 804, 806, 808 each include an RF front-end module (FEM) 860, 862, 864, 868. Each of the RF FEM 860, 862, 864, 868 include a power amplifier that is configured to amplify its respective upconverted RF signals 802T, 804T, 806T, 808T so that the upconverted RF signals 802T, 804T, 806T, 808T are transmitted by one or more of the antennas 826, 828, 830, 832.

The RF signals 802R, 804R, 806R, 808R are received from one or more of the antennas 826, 828, 830, 832 in a different XCVR frequency band. The RF FEM 860, 862, 864, 868 include a low noise amplifier (LNA) configured to amplify the RF signals 802R, 804R, 806R, 808R within their particular XCVR frequency band. The XCVR U/D circuitry 850 is then configured to down convert the amplified RF signals 802R, 804R, 806R, 808R to baseband for processing by the baseband circuitry 842.

The RF transceiver chains 810, 812, 814, 816 share a UNII 1-4 (U/D) circuitry 870. The UNII 1-4 U/D circuitry 870 is configured to upconvert RF signals 810T, 812T, 814T, 816T into a UNII 1-4 (U/D) circuitry 870. The RF transceiver chains 810, 812 operate in UNII-1 to UNII-3. The RF transceiver chains 814, 816 operate in UNII-1 to UNII-4. The RF transceiver chains 818, 820, 822, 826 all work in the 6 GHz band, which covers UNII-5 to UNII-8. The RF transceiver chains 818 and 820, which operate in UNII-5 to UNII-8, have the ability to get their lower band edges shifted based on which shunt resonator is shorted to ground. Accordingly, this allows the RF transceiver chains 818, 820 to operate in conjunction with the 5 GHz band RF transceiver chains 814, 818, which support 5 GHz up to UNII-4.

The RF transceiver chain 810 includes a FEM module 872 that includes a power amplifier that is configured to amplify the upconverted RF signal 810T. A BAW filter 700A is configured to filter the upconverted RF signal 810T. The BAW filter 700A has the same filter design as the BAW filter 700 of FIG. 7. In this embodiment, the input node 408 is hardwired to the FEM module 872 while the other nodes 412, 634A, 634B, 638A, 638B, 522, 526 are left unconnected. The BAW filter 700A filters the RF signal 810T and the RF signal 810T is transmitted by one or more of the antennas 826, 828, 830, 832.

The RF signal 810R is configured to be received on one or more of the antennas 826, 828, 830, 832. The RF signal 810R is filtered by the BAW filter 700A and is then received by the RF FEM module 872. The RF FEM module 872 includes an LNA that amplifies the received RF signal 810R after filtering by the BAW filter 700A. The UNII 1-4 (U/D) circuitry 870 then downconverts the RF signal 810R for processing by the baseband circuitry 842.

The RF transceiver chain 812 includes a FEM module 874 that includes a power amplifier that is configured to amplify the upconverted RF signal 812T. A BAW filter 700B is configured to filter the upconverted RF signal 812T. The BAW filter 700B has the same filter design as the BAW filter 700 of FIG. 7. In this embodiment, the input node 408 is hardwired to the FEM module 874 while the other nodes 412, 634A, 634B, 638A, 638B, 522, 526 are left unconnected. The BAW filter 700B filters the RF signal 812T and the RF signal 812T is then transmitted by one or more of the antennas 826, 828, 830, 832.

The RF signal 812R is configured to be received on one or more of the antennas 826, 828, 830, 832. The RF signal 810R is filtered by the BAW filter 700A and is then received by the RF FEM module 874. The RF FEM module 874 includes an LNA that amplifies the received RF signal 812R after filtering by the BAW filter 700A. The UNII 1-4 (U/D) circuitry 870 then downconverts the RF signal 812R for processing by the baseband circuitry 842.

The RF transceiver chain 814 includes a FEM module 876 that includes a power amplifier that is configured to amplify the upconverted RF signal 814T. A BAW filter 700C is configured to filter the upconverted RF signal 814T. The BAW filter 700C has the same filter design as the BAW filter 700 of FIG. 7. In this embodiment, the input node 412 is hardwired to the FEM module 876 while the other nodes 408, 634A, 634B, 638A, 638B, 522, 526 are left unconnected. The BAW filter 700C filters the RF signal 814T and the RF signal 814T is transmitted by one or more of the antennas 826, 828, 830, 832.

The RF signal 814R is configured to be received on one or more of the antennas 826, 828, 830, 832. The RF signal 814R is filtered by the BAW filter 700C and is then received by the RF FEM module 876. The RF FEM module 876 includes an LNA that amplifies the received RF signal 814R after filtering by the BAW filter 700C. The UNII 1-4 (U/D) circuitry 870 then downconverts the RF signal 814R for processing by the baseband circuitry 842.

The RF transceiver chain 816 includes a FEM module 878 that includes a power amplifier that is configured to amplify the upconverted RF signal 816T. A BAW filter 700D is configured to filter the upconverted RF signal 816T. The BAW filter 700D has the same filter design as the BAW filter 700 of FIG. 7. In this embodiment, the input node 412 is hardwired to the FEM module 876 while the other nodes 408, 634A, 634B, 638A, 638B, 522, 526 are left unconnected. The BAW filter 700D filters the RF signal 816T and the RF signal 816T is transmitted by one or more of the antennas 826, 828, 830, 832.

The RF signal 816R is configured to be received on one or more of the antennas 826, 828, 830, 832. The RF signal 816R is filtered by the BAW filter 700D and is then received by the RF FEM module 878. The RF FEM module 878 includes an LNA that amplifies the received RF signal 816R after filtering by the BAW filter 700D. The UNII 1-4 (U/D)

circuitry 870 then downconverts the RF signal 816R for processing by the baseband circuitry 842.

The RF transceiver chains 818, 820, 822, 824 share a UNII 5-8 (U/D) circuitry 880. The UNII 5-8 (U/D) circuitry 880 is configured to upconvert RF signals 818T, 820T, 822T, 824T into a UNII 5-8 (U/D) circuitry 880. The RF signal 818T is upconverted. The RF signal 820T is upconverted. The RF signal 822T is upconverted into a UNII-7. The RF signal 824T is upconverted.

The RF transceiver chain 818 includes a FEM module 882 that includes a power amplifier that is configured to amplify the upconverted RF signal 818T. A BAW filter 700E is configured to filter the upconverted RF signal 818T. The BAW filter 700E has the same filter design as the BAW filter 700 of FIG. 7. In this embodiment, the ground node 634A is hardwired to ground of the RF front-end circuitry 700 while the other nodes 408, 412, 634A, 634B, 638A, 638B, 522, 526 are left unconnected. The BAW filter 700E filters the RF signal 818T and the RF signal 818T is transmitted by the antenna 834.

The RF signal 818R is configured to be received on one or more of the antennas 834. The RF signal 818R is filtered by the BAW filter 700E and is then received by the RF FEM module 882. The RF FEM module 882 includes an LNA that amplifies the received RF signal 818R after filtering by the BAW filter 700E. The UNII 5-8 (U/D) circuitry 880 then downconverts the RF signal 818R for processing by the baseband circuitry 842.

The RF transceiver chain 820 includes a FEM module 884 that includes a power amplifier that is configured to amplify the upconverted RF signal 820T. A BAW filter 700F is configured to filter the upconverted RF signal 820T. The BAW filter 700F has the same filter design as the BAW filter 700 of FIG. 7. In this embodiment, the ground node 634B is hardwired to the FEM module 884 while the other nodes 408, 412, 634A, 638A, 638B, 522, 526 are left unconnected. In some embodiments, the output node 522 is also hardwired to the antenna 828 while the other nodes 408, 412, 634A, 634B, 638A, 638B, 526. The BAW filter 700F filters the RF signal 820T and the RF signal 820T is transmitted by the antenna 836.

The RF signal 820R is configured to be received on the antenna 836. The RF signal 820R is filtered by the BAW filter 700F and is then received by the RF FEM module 884. The RF FEM module 884 includes an LNA that amplifies the received RF signal 820R after filtering by the BAW filter 700F. The UNII 5-8 (U/D) circuitry 880 then downconverts the RF signal 820R for processing by the baseband circuitry 842.

The RF transceiver chain 822 includes a FEM module 886 that includes a power amplifier that is configured to amplify the upconverted RF signal 822T. A BAW filter 700G is configured to filter the upconverted RF signal 822T. The BAW filter 700G has the same filter design as the BAW filter 700 of FIG. 7. In this embodiment, the ground node 638A is hardwired to the FEM module 886 while the other nodes 408, 412, 634A, 634B, 638B, 522, 526 are left unconnected. In some embodiments, the output node 526 is also hardwired to the antenna 830 while the other nodes 408, 412, 634A, 634B, 638B, 522 are left unconnected. The BAW filter 700G filters the RF signal 822T and the RF signal 822T is transmitted by the antenna 838.

The RF signal 822R is configured to be received on the antenna 838. The RF signal 822R is filtered by the BAW filter 700G and is then received by the RF FEM module 886. The RF FEM module 886 includes an LNA that amplifies the received RF signal 822R after filtering by the BAW filter 700G. The UNII 5-8 (U/D) circuitry 880 then downconverts the RF signal 822R for processing by the baseband circuitry 842.

The RF transceiver chain 824 includes a FEM module 888 that includes a power amplifier that is configured to amplify the upconverted RF signal 824T. A BAW filter 700H is configured to filter the upconverted RF signal 824T. The BAW filter 700H has the same filter design as the BAW filter 700 of FIG. 7. In this embodiment, the ground node 638B is hardwired to the FEM module 886 while the other nodes 408, 412, 634A, 634B, 638A, 522, 526 are left unconnected. In some embodiments, the output node 526 is also hardwired to the antenna 832 while the other nodes 408, 412, 634A, 634B, 638A, 522 are left unconnected. The BAW filter 700H filters the RF signal 824T and the RF signal 824T is transmitted by the antenna 840.

The RF signal 824R is configured to be received by the antenna 840. The RF signal 824R is filtered by the BAW filter 700H and is then received by the RF FEM module 888. The RF FEM module 888 includes an LNA that amplifies the received RF signal 824R after filtering by the BAW filter 700H. The UNII 5-8 (U/D) circuitry 880 then downconverts the RF signal 824R for processing by the baseband circuitry 842.

Note that the BAW filters 700A-700H have the same filter design. The variation between the BAW filters 700A-700H is the combination of the nodes 408, 412, 634A, 634B, 638A, 638B, 522, 526 that are hardwired and the combination of the nodes 408, 412, 634A, 634B, 638A, 638B, 522, 526 that are left unconnected. In this manner, the high corner frequencies and the low corner frequencies of the passbands are shifted, as explained in FIG. 4-FIG. 7 so that the passbands are placed in the appropriate frequency band and to provide the appropriate rejection outside of the frequency band. Note, furthermore, that, during manufacturing of the RF front-end circuitry 800, sorting of BAW filters with different filter designs is not needed since the BAW filters 700A-700H all have the same filter design. Instead, the manufacturing process only takes account of the combination of the nodes 408, 412, 634A, 634B, 638A, 638B, 522, 526 that are hardwired and the combination of the nodes 408, 412, 634A, 634B, 638A, 638B, 522, 526 that are left unconnected for each of the transceiver chains 810, 812, 814, 816, 818, 820, 822, 824.

Please note that, in some embodiments, the RF transceiver chains 802, 804, 806, 808 are diplexed with the 5 GHz RF transceiver chains 810, 812, 814, 816. In other embodiments, the RF transceiver chains 810, 812, 814, 816 can be replaced by the 6 GHz RF transceiver chains 818, 820, 822, 824.

FIG. 9 illustrates a flow diagram 900 that illustrates a method of manufacturing RF front-end circuitry, in accordance with some embodiments.

Embodiments of the RF front-end circuitry described herein can be manufactured in accordance with the method described herein. In some embodiments, implementing the method described in the flow chart results in RF front-end circuitry manufactured in one or more integrated circuits.

At block 902, a first transceiver chain is formed that includes a first BAW filter, the first BAW filter having a filter design. Flow then proceeds to block 904.

At block 904, a network of BAW resonators is formed such that the first BAW filter includes a network of BAW resonators and the second BAW filter includes a network of BAW resonators with a same BAW network configuration and a set of external pins such that that the first BAW filter includes a set of external pins and the second BAW filter includes a set of external pins with a same external pin configuration. Flow then proceeds to block 906.

At block 906, a first combination of the external pin configuration of one or more external pins in the set of external pins of the first BAW filter in the first transceiver chain is hardwired. Flow then proceeds to block 908.

At block 908, a second combination of the external pin configuration of one or more external pins in the set of external pins of the second BAW filter in the second transceiver chain is hardwired such that the first combination of the external pin configuration is different than the second combination of the external pin configuration.

Figure 10:
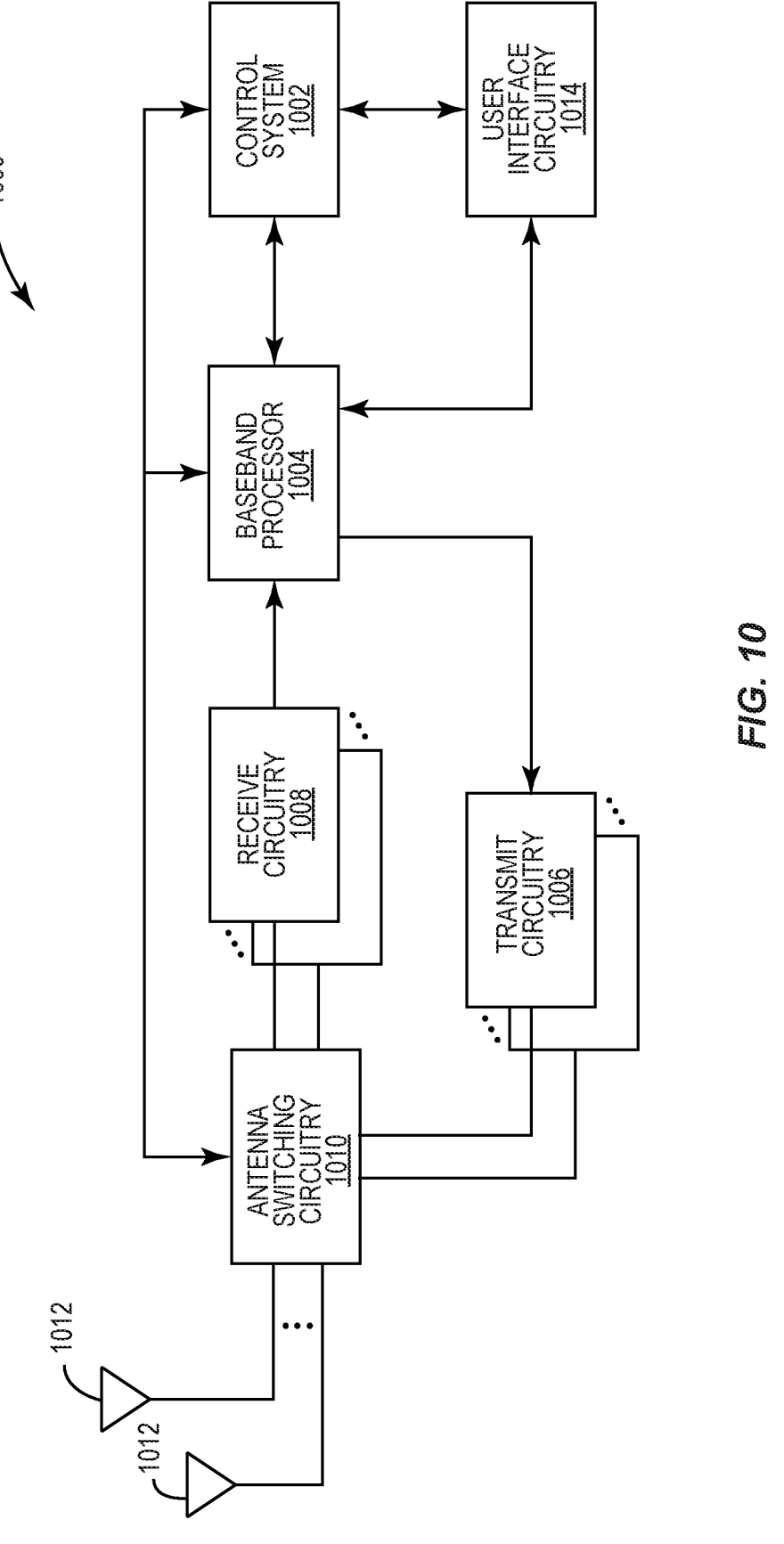
FIG. 10 is a user element, in accordance with some embodiments.

With reference to FIG. 10, the concepts described above may be implemented in various types of user elements 1000, such as mobile terminals, smart watches, tablets, computers, navigation devices, access points, and like wireless communication devices that support wireless communications, such as cellular, wireless local area network (WLAN), Bluetooth, and near field communications. The user element 1000 will generally include a control system 1002, a baseband processor 1004, transmit circuitry 1006, receive circuitry 1008, antenna switching circuitry 1010, multiple antennas 1012, and user interface circuitry 1014. In a non-limiting example, the control system 1002 may be a field-programmable gate array (FPGA) or an application-specific integrated circuit (ASIC). In this regard, the control system 1002 may include at least microprocessor(s), embedded memory circuit(s), and communication bus interface(s). The receive circuitry 1008 receives radio frequency signals via the antennas 1012 and through the antenna switching circuitry 1010 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 1004 processes the digitized received signal to extract the information or data bits conveyed in the received signal. This processing typically comprises demodulation, decoding, and error correction operations, as will be discussed in greater detail below. The baseband processor 1004 is generally implemented in one or more digital signal processors (DSPs) and ASICs.

For transmission, the baseband processor 1004 receives digitized data, which may represent voice, data, or control information, from the control system 1002, which it encodes for transmission. The encoded data is output to the transmit circuitry 1006, where digital-to-analog converter(s) (DAC(s)) convert the digitally encoded data into an analog signal and a modulator modulates the analog signal onto a carrier signal that is at a desired transmit frequency or frequencies. A power amplifier will amplify the modulated carrier signal to a level appropriate for transmission and deliver the modulated carrier signal to the antennas 1012 through the antenna switching circuitry 1010. The multiple antennas 1012 and the replicated transmit and receive circuitries 1006, 1008 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency (RF) front-end circuitry, comprising:
a first transceiver chain that includes a first bulk acoustic wave (BAW) filter, the first BAW filter having a filter design;
a second transceiver chain that includes a second BAW filter having a same filter design as the first BAW filter, wherein the filter design includes:
a network of BAW resonators such that the first BAW filter includes a network of BAW resonators and the second BAW filter includes a network of BAW resonators with a same BAW network configuration; and
a set of external pins such that that the first BAW filter includes a set of external pins and the second BAW filter includes a set of external pins with a same external pin configuration;
wherein a first combination of the external pin configuration of one or more external pins in the set of external pins of the first BAW filter is hardwired in the first transceiver chain; and
wherein a second combination of the external pin configuration of one or more external pins in the set of external pins of the second BAW filter is hardwired in the second transceiver chain such that the first combination of the external pin configuration is different than the second combination of the external pin configuration.

2. The RF front-end circuitry of claim 1, further comprising:
a third transceiver chain that includes a third BAW filter having the same filter design, wherein:
the third BAW filter includes a network of BAW resonators with the same BAW network configuration;
the third BAW filter includes a set of external pins with the same external pin configuration;
a third combination of the external pin configuration of one or more external pins in the set of external pins of the third BAW filter is hardwired in the third transceiver chain; and
the third combination is different than the first combination and the second combination.

3. The RF front-end circuitry of claim 2, further comprising:
a fourth transceiver chain that includes a fourth BAW filter having the same filter design, wherein:
the fourth BAW filter includes a network of BAW resonators with the same BAW network configuration;
the fourth BAW filter includes a set of external pins with the same external pin configuration;
a fourth combination of the external pin configuration of one or more external pins in the set of external pins of the fourth BAW filter is hardwired in the fourth transceiver chain; and
the fourth combination is different than the first combination, the second combination, and the third combination.

4. The RF front-end circuitry of claim 1, wherein:
the first BAW filter defines a first passband; and
the second BAW filter defines a second passband, wherein the second passband is shifted with respect to the first passband as a result of the first combination being different than the second combination.

5. The RF front-end circuitry of claim 1, wherein:
the network of BAW resonators in the filter design defines a first input path with a first BAW resonator and a second input path with a second BAW resonator such that:
the network of BAW resonators in the first BAW filter includes a first input path with a first BAW resonator and a second input path with a second BAW resonator;
the network of BAW resonators in the second BAW filter includes a first input path with a first BAW resonator and a second input path with a second BAW resonator;
the first input path of the first BAW filter is hardwired in the first transceiver chain and the second input path of the first BAW filter is unconnected; and
the first input path of the second BAW filter is unconnected and the second input path of the second BAW filter is hardwired in the second transceiver chain.

6. The RF front-end circuitry of claim 1, wherein:
the network of BAW resonators in the filter design defines a first input path with a first BAW resonator and a second input path with a second BAW resonator such that:
the network of BAW resonators in the first BAW filter includes a first input path with a first BAW resonator and a second input path with a second BAW resonator;
the network of BAW resonators in the first BAW filter includes a first input path with a first BAW resonator and a second input path with a second BAW resonator;
the first input path of the first BAW filter is hardwired in the first transceiver chain and the second input path of the first BAW filter is unconnected; and
the first input path of the second BAW filter is unconnected and the second input path of the second BAW filter is hardwired in the second transceiver chain.

7. The RF front-end circuitry of claim 6, wherein:
the first BAW filter defines a first passband having a first low corner frequency;
the second BAW filter defines a second passband having a second low corner frequency; and
wherein the first low corner frequency is shifted with respect to the second low corner frequency.

8. The RF front-end circuitry of claim 1, wherein:
the network of BAW resonators in the filter design defines a first output path with a first BAW resonator and a second output path with a second BAW resonator such that:
the network of BAW resonators in the first BAW filter includes a first output path with a first BAW resonator and a second output path with a second BAW resonator;
the network of BAW resonators in the second BAW filter includes a first output path with a first BAW resonator and a second output path with a second BAW resonator;
the first output path of the first BAW filter is hardwired in the first transceiver chain and the second output path of the first BAW filter is unconnected; and the first output path of the second BAW filter is unconnected and the second output path of the second BAW filter is hardwired in the second transceiver chain.

9. The RF front-end circuitry of claim 8, wherein:

the first BAW filter defines the first passband having a first high corner frequency;

the second BAW filter defines the second passband having a second high corner frequency;

wherein the first high corner frequency is shifted with respect to the second high corner frequency.

10. The RF front-end circuitry of claim 1, wherein:

the network of BAW resonators in the filter design defines a first ground path with a first BAW resonator and a second ground path with a second BAW resonator such that:

the network of BAW resonators in the first BAW filter includes the first ground path with the first BAW resonator and the second ground path with the second BAW resonator;

the network of BAW resonators in the second BAW filter includes a first ground path with a first BAW resonator and a second ground path with a second BAW resonator;

the first ground path of the first BAW filter is hardwired in the first transceiver chain and the second ground path of the first BAW filter is unconnected;

the first ground path of the second BAW filter is unconnected and the second ground path of the second BAW filter is hardwired in the second transceiver chain.

11. The RF front-end circuitry of claim 10, wherein no switch is connected directly to any pin in the set of external pins of the first BAW filter and no switch is connected directly to any pin in the set of external pins of the second BAW filter.

12. Radio frequency (RF) front-end circuitry, comprising:

a first transceiver chain that includes a first bulk acoustic wave (BAW) filter, the first BAW filter having a filter design defining a set of external pins;

a second transceiver chain that includes a second BAW filter, the second BAW filter having the same filter design and thus also defining a set of external pins;

wherein a first combination of one or more pins in the set of external pins of the first BAW filter are hardwired in the first transceiver chain;

wherein a second combination of one or more pins in the set of external pins of the second BAW filter are hardwired in the second transceiver chain; and wherein the first combination is different than the second combination.

13. The RF front-end circuitry of claim 12, further comprising:

a third transceiver chain that includes a third BAW filter having the same filter design defining a set of external pins, wherein:

a third combination of one or more pins in the set of external pins of the third BAW filter are hardwired in the third transceiver chain; and the third combination is different than the first combination and the second combination.

14. The RF front-end circuitry of claim 13, further comprising:

a fourth transceiver chain that includes a fourth BAW filter having the same filter design defining a set of external pins, wherein:

a fourth combination of one or more pins in the set of external pins of the fourth BAW filter are hardwired in the fourth transceiver chain; and the fourth combination is different than the first combination, the second combination, and the third combination.

15. The RF front-end circuitry of claim 12, wherein:

the first BAW filter defines a first passband having a first low corner frequency;

the second BAW filter defines a second passband having a second low corner frequency; and wherein the first low corner frequency is shifted with respect to the second low corner frequency.

16. The RF front-end circuitry of claim 12, wherein:

the first BAW filter defines a first passband having a first high corner frequency;

the second BAW filter defines a second passband having a second high corner frequency; and wherein the first high corner frequency is shifted with respect to the second high corner frequency.

17. The RF front-end circuitry of claim 12, wherein no switch is connected directly to any pin in the set of external pins of the first BAW filter and no switch is connected directly to any pin in the set of external pins of the second BAW filter.

18. The RF front-end circuitry of claim 12, wherein the first BAW filter defines a passband in Unlicensed National Information Infrastructure band 4.

19. The RF front-end circuitry of claim 18, wherein the first BAW filter defines a passband in Unlicensed National Information Infrastructure band 5.

20. The RF front-end circuitry of claim 12, wherein:

the first transceiver chain includes a first upstream circuitry connected to one or more of the set of external pins of the first BAW filter; and the second transceiver chain includes a second upstream circuitry connected to one or more of the set of external pins of the second BAW filter.

21. A method of manufacturing radio frequency (RF) front-end circuitry comprising:

forming a first transceiver chain that includes a first bulk acoustic wave (BAW) filter, the first BAW filter having a filter design;

forming a first transceiver chain that includes a first bulk acoustic wave (BAW) filter, the first BAW filter having a filter design;

hardwiring a first combination of the external pin configuration of one or more external pins in the set of external pins of the first BAW filter in the first transceiver chain;

hardwiring a second combination of the external pin configuration of one or more external pins in the set of external pins of the second BAW filter in the second transceiver chain such that the first combination of the external pin configuration is different than the second combination of the external pin configuration.

22. A user element comprising radio frequency (RF) front-end circuitry, the RF front-end circuitry comprising:

a first transceiver chain that includes a first bulk acoustic wave (BAW) filter, the first BAW filter having a filter design;

a second transceiver chain that includes a second BAW filter having a same filter design as the first BAW filter, wherein the filter design includes:

a network of BAW resonators such that the first BAW filter includes a network of BAW resonators and the second BAW filter includes a network of BAW resonators with a same BAW network configuration; and a set of external pins such that that the first BAW filter includes a set of external pins and the second BAW filter includes a set of external pins with a same external pin configuration;

wherein a first combination of the external pin configuration of one or more external pins in the set of external pins of the first BAW filter is hardwired in the first transceiver chain; and wherein a second combination of the external pin configuration of one or more external pins in the set of external pins of the second BAW filter is hardwired in the second transceiver chain such that the first combination of the external pin configuration is different than the second combination of the external pin configuration.

\* \* \* \* \*